United States Patent
Yang et al.

(10) Patent No.: US 12,446,251 B2
(45) Date of Patent: Oct. 14, 2025

(54) CAPACITANCE NETWORKS FOR ENHANCING HIGH VOLTAGE OPERATION OF A HIGH ELECTRON MOBILITY TRANSISTOR AND METHOD THEREIN

(71) Applicant: POWER INTEGRATIONS, INC., San Jose, CA (US)

(72) Inventors: Kuo-Chang Yang, Campbell, CA (US); Sorin Georgescu, Gilroy, CA (US); Alexey Kudymov, Ringoes, NJ (US); Kamal Varadarajan, Fremont, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 646 days.

(21) Appl. No.: 17/621,852

(22) PCT Filed: Jun. 24, 2020

(86) PCT No.: PCT/US2020/039344
§ 371 (c)(1),
(2) Date: Dec. 22, 2021

(87) PCT Pub. No.: WO2021/011163
PCT Pub. Date: Jan. 21, 2021

(65) Prior Publication Data
US 2022/0262941 A1     Aug. 18, 2022

Related U.S. Application Data

(60) Provisional application No. 62/873,307, filed on Jul. 12, 2019.

(51) Int. Cl.
*H10D 30/47*     (2025.01)
*H10D 1/62*     (2025.01)
(Continued)

(52) U.S. Cl.
CPC ............. *H10D 30/475* (2025.01); *H10D 1/62* (2025.01); *H10D 62/8503* (2025.01);
(Continued)

(58) Field of Classification Search
CPC ............. H01L 29/7786; H01L 27/0629; H01L 29/2003; H01L 29/402; H01L 29/92;
(Continued)

(56) References Cited

U.S. PATENT DOCUMENTS 9,691,755 B2    6/2017    Kudymov et al.
9,761,675 B1 *   9/2017    Marinella ............. H01L 29/405
(Continued)

FOREIGN PATENT DOCUMENTS

CN      105720096 A    6/2016
CN      107039517 A    8/2017
(Continued)

OTHER PUBLICATIONS

Dora et al. (IEEE Electron Device Letters, vol. 27, No. 9, Sep. 2006) (Year: 2006).*
(Continued)

*Primary Examiner* — Eliseo Ramos Feliciano
*Assistant Examiner* — Jaesun Lee
(74) *Attorney, Agent, or Firm* — Brian H. Floyd

(57) ABSTRACT

Capacitance networks for enhancing high voltage operation of high electron mobility transistors (HEMTs) are presented herein. A capacitance network, integrated and/or external, may be provided with a fixed number of capacitively coupled field plates to distribute the electric field in the drift region. The capacitively coupled field plates may advantageously be fabricated on the same metal layer to lower cost; and the capacitance network may be provided to control field plate potentials. The potentials on each field plate may be pre-determined through the capacitance network, result-
(Continued)

ing in a uniform, and/or a substantially uniform electric field distribution along the drift region.

10 Claims, 22 Drawing Sheets

(51) Int. Cl.
*H10D 62/85* (2025.01)
*H10D 64/00* (2025.01)
*H10D 64/62* (2025.01)
*H10D 84/80* (2025.01)

(52) U.S. Cl.
CPC ......... *H10D 64/111* (2025.01); *H10D 84/811* (2025.01); *H10D 64/62* (2025.01)

(58) Field of Classification Search
CPC . H01L 29/45; H01L 29/41758; H01L 29/404; H01L 29/778
See application file for complete search history.

(56) References Cited

U.S. PATENT DOCUMENTS

| | | | |
|---|---|---|---|
| 2009/0032820 | A1 | 2/2009 | Chen |
| 2009/0256210 | A1* | 10/2009 | Matsushita ......... H01L 29/7787 257/E21.409 |
| 2012/0086052 | A1 | 4/2012 | Chen et al. |
| 2014/0001479 | A1* | 1/2014 | Kudymov ............. H01L 29/205 257/E21.409 |
| 2014/0084386 | A1 | 3/2014 | Takeda et al. |
| 2016/0218189 | A1* | 7/2016 | Oasa ................. H01L 29/7786 |
| 2017/0018617 | A1* | 1/2017 | Xia ................... H01L 29/7786 |

FOREIGN PATENT DOCUMENTS

| | | |
|---|---|---|
| EP | 3370260 A1 | 9/2018 |
| GB | 201711361 | 8/2017 |
| JP | 2006-351753 A | 12/2006 |
| JP | 2011-119366 A | 6/2011 |
| JP | 2011-210752 A | 10/2011 |
| JP | 2015050434 A | 3/2015 |
| JP | 2018196026 A | 12/2018 |
| WO | 2014004764 A1 | 1/2014 |

OTHER PUBLICATIONS

PCT Application No. PCT/US20/39344; International Search Report and Written Opinion of the International Searching Authority; Sep. 15, 2020; 10 pages.
Taiwan Office Action and Search Report; Application No. 109122790; Mar. 21, 2023; 6 pages.
Machine Translation of Taiwan Office Action and Search Report; Application No. 109122790; Mar. 21, 2023; 5 pages.
European Application Serial No. 20740752.9, Communication pursuant to Rules 94(3) EPC mailed Dec. 1, 2023, 5 pages.
Japanese Patent Application No. 2022-500903; Notice of Reasons for Refusal with Machine Translation mailed Sep. 5, 2023; 8 pages.
Japanese Serial No. 2022-500903, Notice of Allowance mailed Jan. 16, 2024 with Machine Translation; 8 pages.
TW Application No. 11320719260, "Office Action and Search Report", 5 pages.
TW Application No. 11320719260, "Machine Translation of Office Action and Search Report", 5 pages.
Korean Patent Application No. 10-2022-7001207; "Office Action with Machine Translation"; mailed May 20, 2024, 10 pages.
European Application Serial No. 20740752.9, "Communication under Rule 71(3) EPC"; mailed Jun. 10, 2024; 8 pages.
CN Application 202080050614.4; "First Office Action with Machine Translation"; mailed Feb. 27, 2025, 6 pages.
CN Application 2020800506144; "Search Report with Machine Translation"; 4 pages.
JP Application 2024-036329; "Notice of Reasons for Refusal with Machine Translation"; mailed Feb. 17, 2025, 8 pages.
European Application Serial No. 24210232.5, Extended European Search Report dated Feb. 11, 2025; 10 pages.

* cited by examiner

US 12,446,251 B2

CAPACITANCE NETWORKS FOR ENHANCING HIGH VOLTAGE OPERATION OF A HIGH ELECTRON MOBILITY TRANSISTOR AND METHOD THEREIN

CROSS-REFERENCE TO RELATED APPLICATIONS

This application is a National Stage Entry of International Patent Application No. PCT/US2020/039344, filed on Jun. 24, 2020, which claims the benefit of U.S. Provisional Application No. 62/873,307 filed on Jul. 12, 2019, incorporated in their entirety herein by reference.

FIELD OF THE DISCLOSURE

The present invention relates to capacitance networks for enhancing high voltage operation of a high electron mobility transistor (HEMT) and more particularly to a lateral gallium nitride (GaN) HEMT having field plates coupled via capacitance networks.

BACKGROUND INFORMATION

Gallium nitride (GaN) and other wide band-gap nitride III based direct transitional semiconductor materials exhibit high break-down electric fields and avail high current densities. In this regard GaN based semiconductor devices are actively researched as an alternative to silicon based semiconductor devices in power and high frequency applications. For instance, a GaN HEMT may provide lower specific on resistance with higher breakdown voltage relative to a silicon power field effect transistor of commensurate area.

Power field effect transistors (FETs) can be enhancement mode or depletion mode. An enhancement mode device may refer to a transistor (e.g., a field effect transistor) which blocks current (i.e., which is off) when there is no applied gate bias (i.e., when the gate to source bias is zero). In contrast, a depletion mode device may refer to a transistor which allows current (i.e., which is on) when the gate to source bias is zero.

BRIEF DESCRIPTION OF THE DRAWINGS

Non-limiting and non-exhaustive embodiments of capacitance networks for enhancing high voltage operation of high electron mobility transistors (HEMTs) are described with reference to the following figures, wherein like reference numerals refer to like parts throughout the various views unless otherwise specified.

Figure 1A:
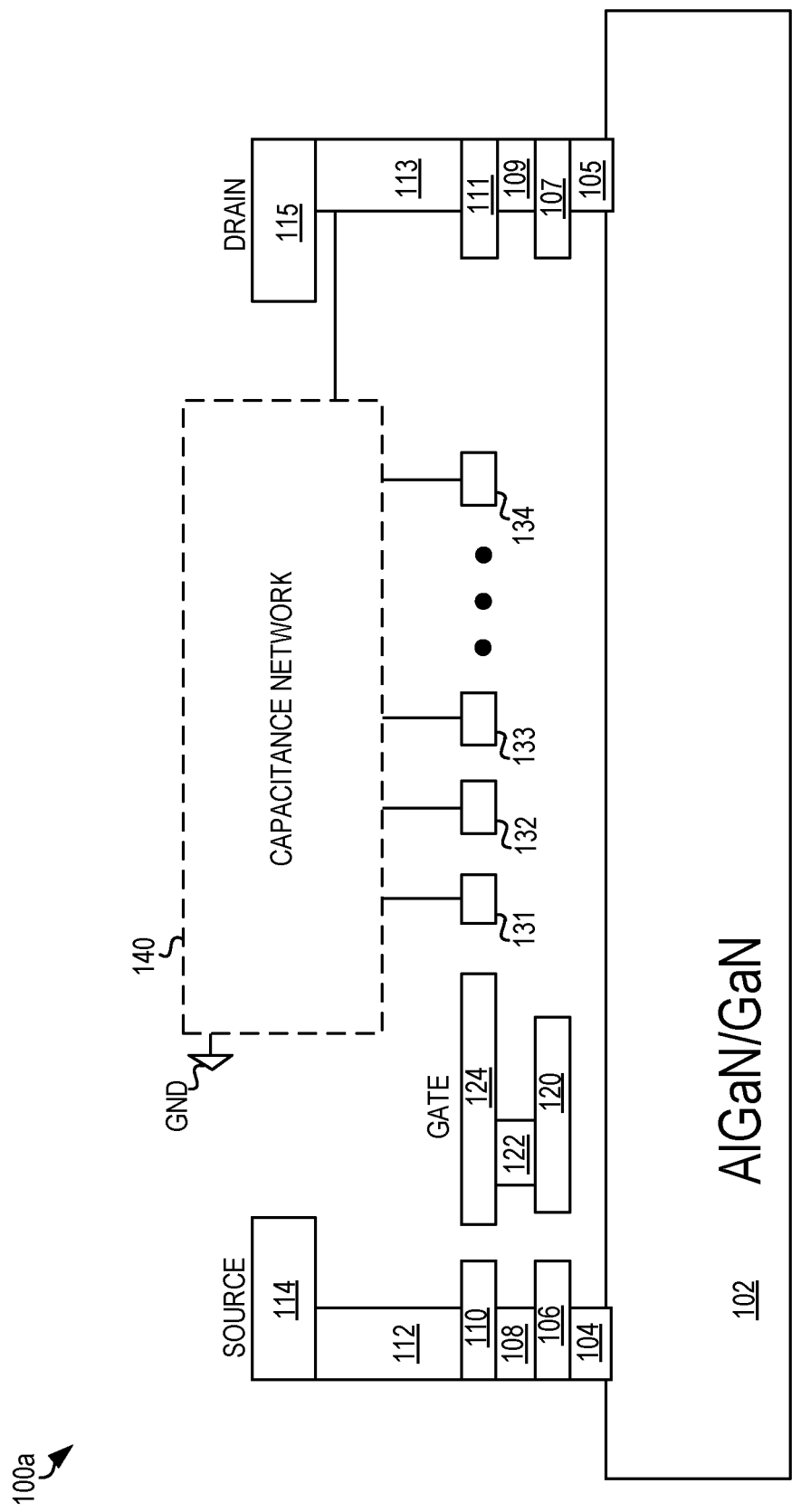
FIG. 1A illustrates a simplified schematic of a device cross section including a capacitance network according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements and layers in the figures may be exaggerated relative to other elements to help to improve understanding of various embodiments of the teachings herein. Also, common but well-understood elements, layers, and/or process steps that are useful or necessary in a commercially feasible embodiment are often not depicted in order to facilitate a less obstructed view of these various embodiments of capacitance networks for enhancing high voltage operation of high electron mobility transistors.

DETAILED DESCRIPTION

In the following description, numerous specific details are set forth in order to provide a thorough understanding of capacitance networks for enhancing high voltage operation of high electron mobility transistors. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment", "an embodiment", "one example" or "an example" means that a particular feature, structure, method, process, and/or characteristic described in connection with the embodiment or example is included in at least one embodiment of capacitance networks for enhancing high voltage operation of high electron mobility transistors. Thus, appearances of the phrases "in one embodiment", "in an embodiment", "one example" or "an example" in various places throughout this specification are not necessarily all referring to the same embodiment or example. Furthermore, the particular features, structures, methods, processes and/or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

In the context of the present application, when a transistor is in an "off-state" or "off" the transistor blocks current and/or does not substantially conduct current. Conversely, when a transistor is in an "on-state" or "on" the transistor is able to substantially conduct current. By way of example, in one embodiment, a high-voltage transistor comprises an N-channel metal-oxide-semiconductor (NMOS) field-effect transistor (FET) with the high-voltage being supported between the first terminal, a drain, and the second terminal, a source. In some embodiments an integrated controller circuit may be used to drive a power switch when regulating energy provided to a load. Also, for purposes of this disclosure, "ground" or "ground potential" refers to a reference voltage or potential against which all other voltages or potentials of an electronic circuit or Integrated circuit (IC) are defined or measured.

As described above, a HEMT and/or a GaN HEMT may provide lower specific on resistance with higher breakdown voltage relative to a silicon power field effect transistor of commensurate area. It has been found, however, that breakdown voltage of HEMTs and/or GaN HEMTs may be limited by non-uniform electric fields in a drift region. Thus, it may be desirable to find ways to distribute an electric field in the drift region so that it becomes uniform and/or substantially uniform.

Traditional approaches to distributing an electric field include using field plates. However, a traditional field plate design for a high voltage HEMT (e.g., a lateral high voltage HEMT) may be limited to providing a square electric field distribution along the drift region; moreover, the traditional field plate design may necessitate a thick dielectric to support a high breakdown voltage. This, in turn, may increase process cost and complexity. Accordingly, it may also be desirable to find ways to distribute an electric field without increasing process cost and complexity.

Capacitance networks for enhancing high voltage operation of high electron mobility transistors (HEMTs) are presented herein. A capacitance network, integrated and/or external, may be provided with a fixed number of capacitively coupled field plates to distribute the electric field in the drift region. The capacitively coupled field plates may advantageously be fabricated on the same metal layer to lower cost; and the capacitance network may be provided to control field plate potentials. The potentials on each field plate may be pre-determined through the capacitance network, resulting in a uniform, and/or a substantially uniform electric field distribution along the drift region.

FIG. 1A illustrates a simplified schematic 100a of a device cross section including a capacitance network 140 according to an embodiment. The simplified schematic 100a depicts a semiconductor layer 102 which may comprise aluminum gallium nitride (AlGaN), gallium nitride (GaN), and/or a combination of both AlGaN and GaN. The simplified schematic 100a further depicts interconnect to a source, gate, and a drain. In one embodiment, interconnect layers may be identified as ohmic contacts 104-105, a source field plate (SFP) 106, a drain field plate (DFP) 107, vias 108-109, a first metal layer 110 (i.e., to the source), a first metal layer 111 (i.e., to the drain), vias 112-113, a second metal layer 114 (i.e., to the source), and a second metal 115 (i.e., to the drain). Additionally, the gate interconnect may include a gate field plate 120, a via 122, and a first metal layer 124 (i.e., to the gate).

A drift region may exist along and/or near the surface (i.e., top) of semiconductor layer 102 between the gate (GATE) and the drain (DRAIN). Along the drift region, field plates 131-134 can be fabricated using the first metal layer so that the field plates 131-134 are disposed above the drift region of semiconductor layer 102. The field plates 131-134 may advantageously be formed on the same metal layer (i.e., metal 1) as first metal layers 110-111, 124 so as to reduce process steps and/or cost.

The capacitance network 140 may be electrically connected to the field plates 131-134, to ground (GND), and/or to the drain at one or more layer (e.g., at via 113). Although the embodiment of FIG. 1A shows four field plates 131-134, there may be greater or fewer than four field plates 131-134. For instance, there may be just one field plate 131.

The capacitance network 140 may be an external network and/or an internal (i.e., integrated) network which may be provided to adjust field plate potentials (i.e., field plate voltages). By adjusting the field plate potentials to known (i.e., selected) values, an electric field within the drift region of semiconductor layer 102 may be adjusted (i.e., distributed) in a controlled manner. In this way, the electric field may be distributed to be substantially uniform.

Figure 1B:
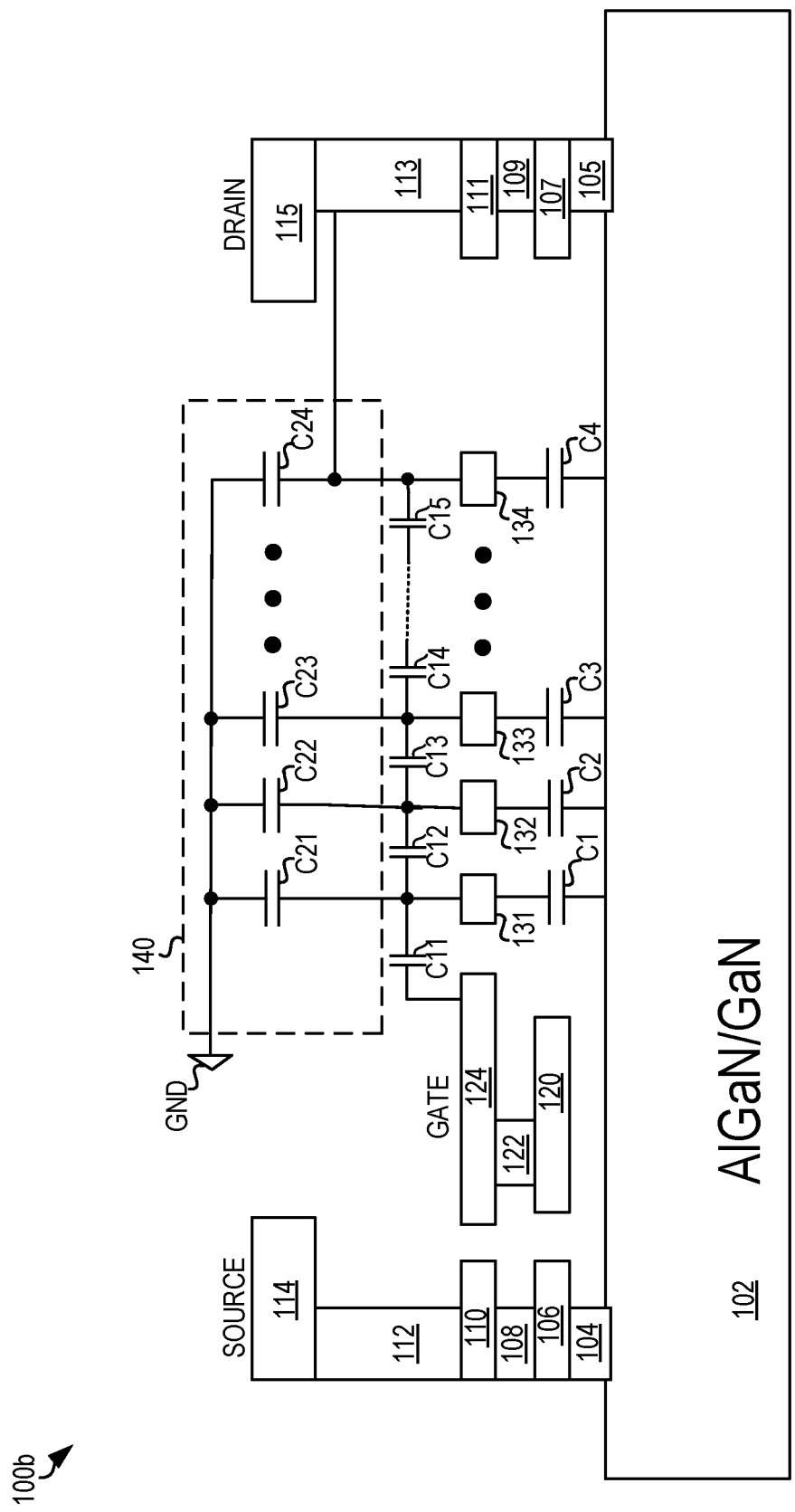
FIG. 1B illustrates a schematic of a device cross section including a capacitance network according to an embodiment.

FIG. 1B illustrates a schematic 100b of a device cross section including a capacitance network 140 according to an embodiment. Schematic 100b illustrates parasitic field plate capacitances C1-C4 and C11-C15. The parasitic field plate capacitances C1-C4 and C11-C15 may give rise to coupling such that field plates 131-134 are capacitively coupled. The capacitance network 140 may provide capacitors C21-C24 tailored to control and/or select field plate potentials (i.e., field plate voltages). The capacitors C21-C24 may be determined, at least in part, by simulation and/or by experiment so as to select the field plate potentials.

Figure 1C:
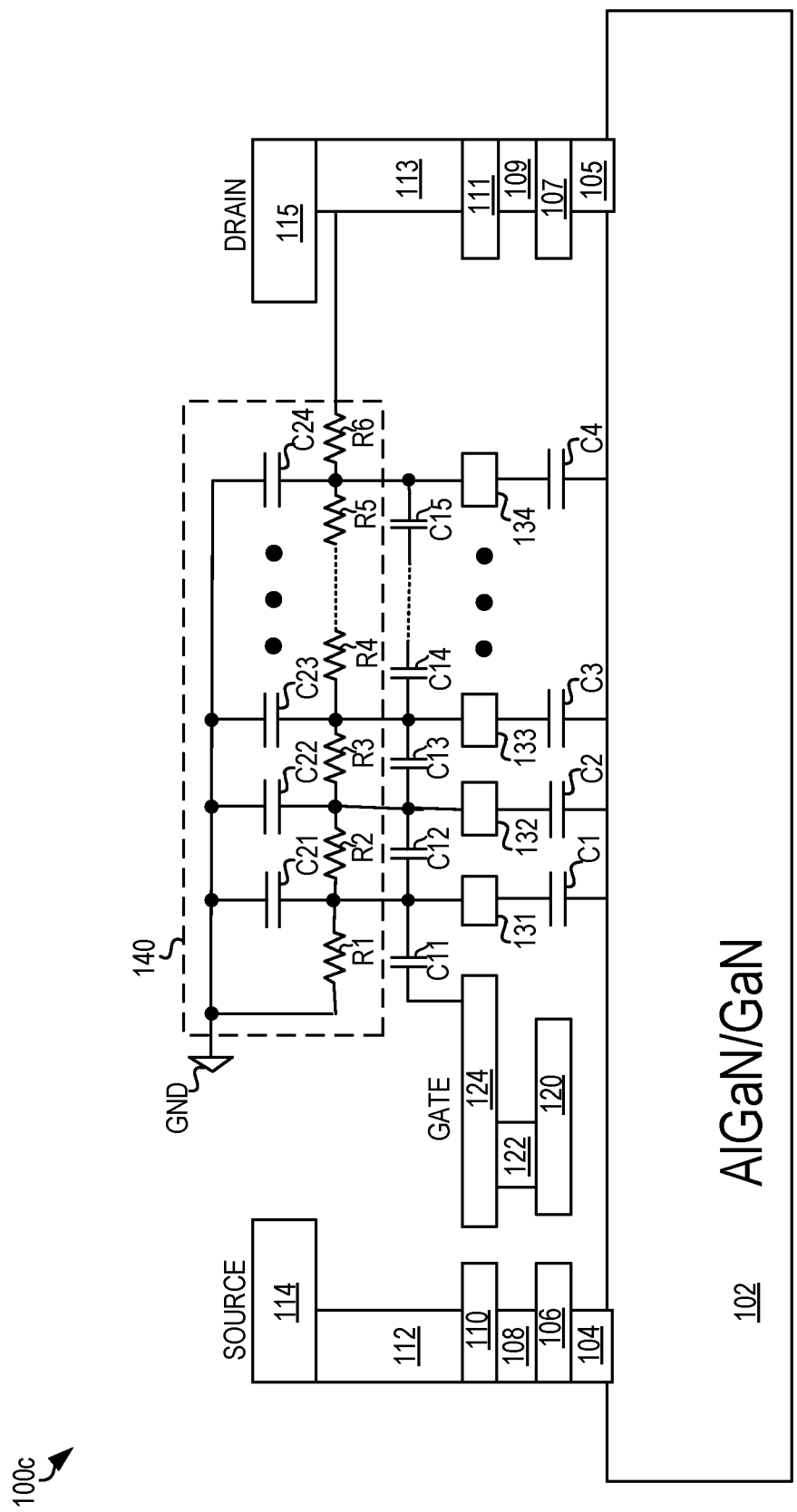
FIG. 1C illustrates a schematic of a device cross section including a capacitance network according to an embodiment.

FIG. 1C illustrates a schematic 100c of a device cross section including a capacitance network 140 according to an embodiment. The capacitance network 140 includes additional impedances R1-R6 electrically coupled between ground (GND) and the drain (i.e., to via 113). The impedances R1-R6 may be resistors, passive elements, and/or non-linear components (e.g., active field effect transistors) tailored to connect to the field plates 131-134. In some embodiments the impedances R1-R6 may advantageously provide a discharge feature allowing charge on the field plates 131-134 to be removed and/or controlled.

Figure 2A:
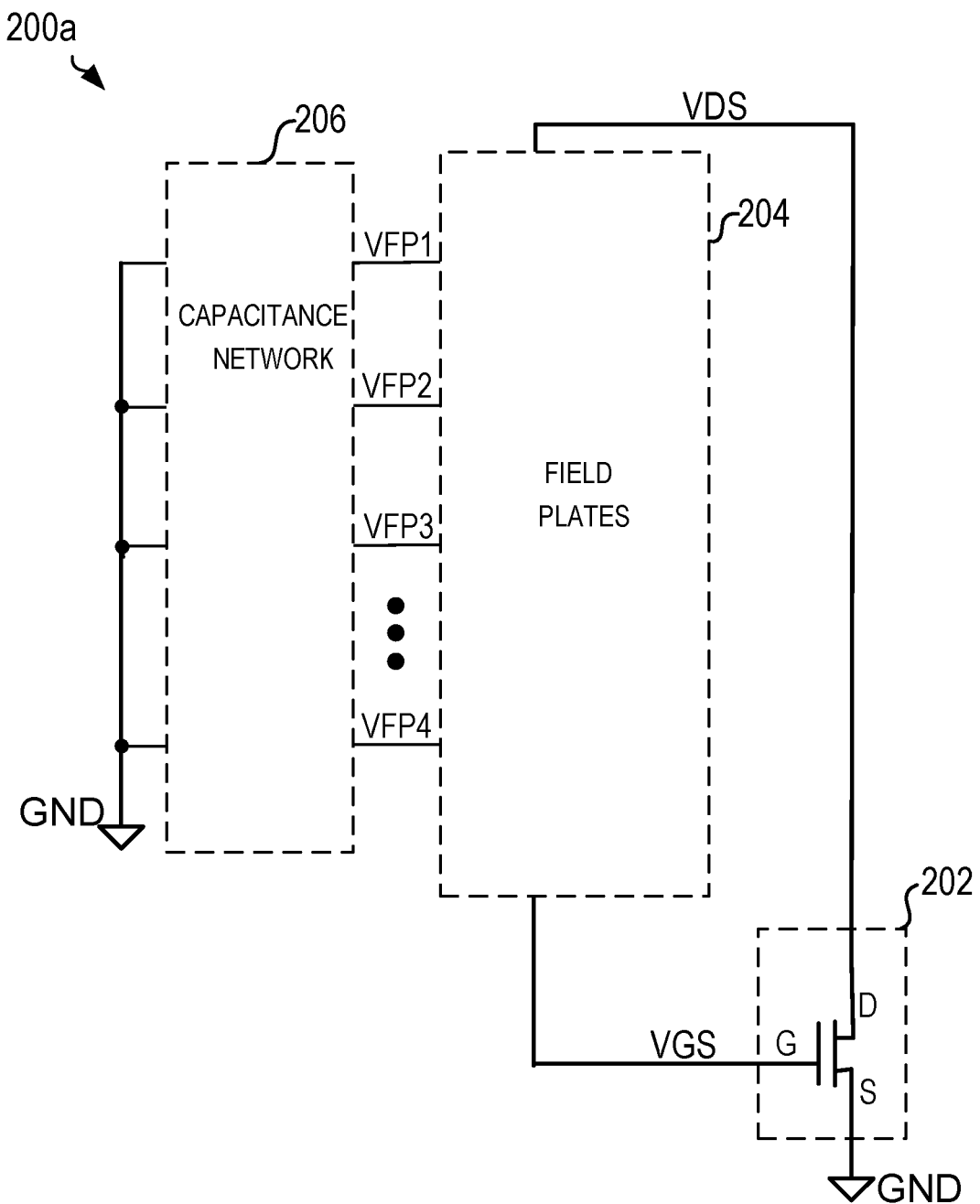
FIG. 2A illustrates a schematic of a device including a capacitance network according to an embodiment.

FIG. 2A illustrates a schematic 200a of a device including a capacitance network 206 according to an embodiment. Schematic 200a includes a transistor 202 having a gate G, source S, and drain D; and as schematically illustrated, field plates 204 may be electrically coupled between the gate G and drain D. Schematic 200a also shows additional information relating to system voltages. For instance, the capacitance network 206 may be coupled to ground (GND) and to the field plates 204 to provide field plate potentials VFP1-VFP4. In addition, a drain to source voltage VDS may be applied at the drain D. Also, a gate to source voltage VGS may be applied at the gate G; and the source S may be connected to ground (GND).

Figure 2B:
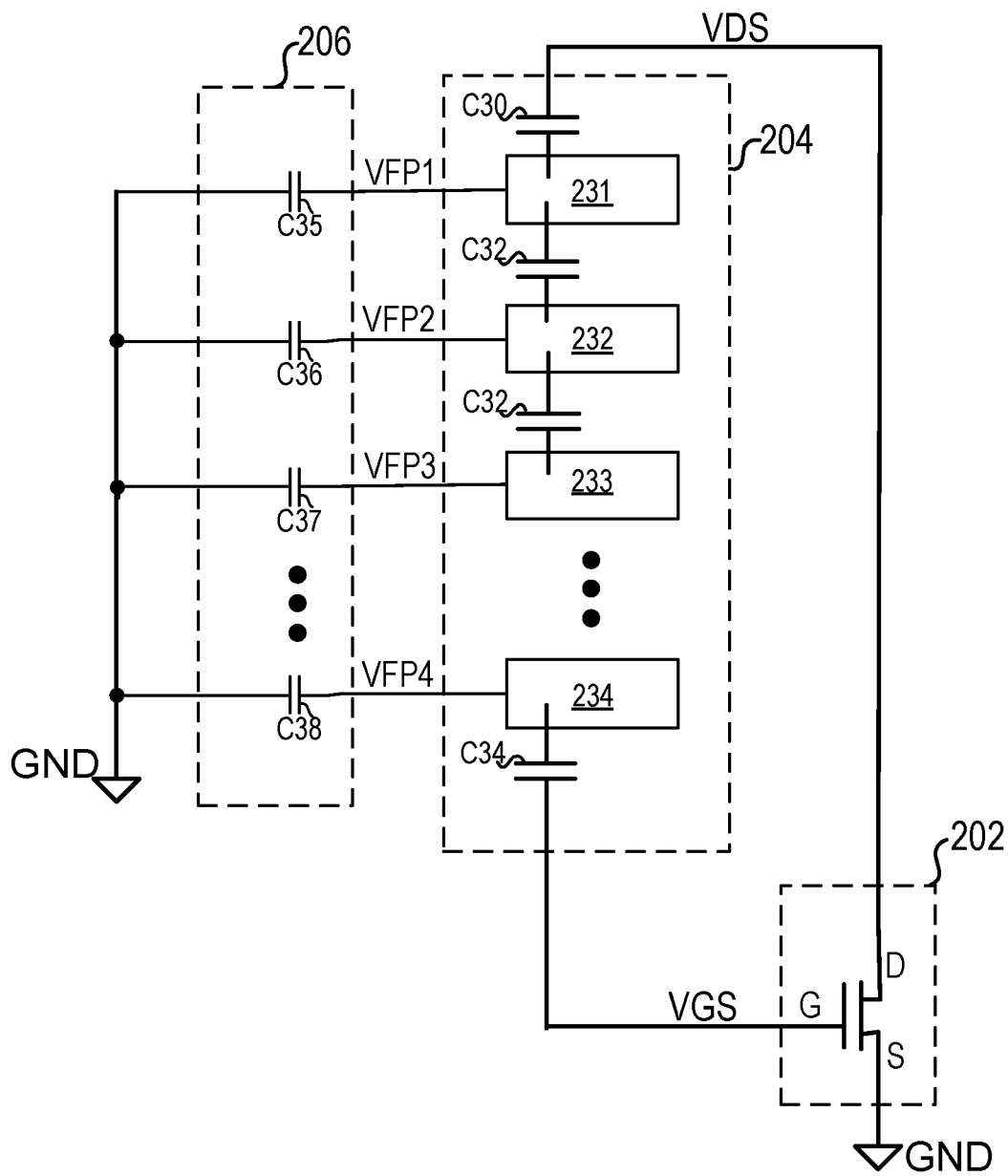
FIG. 2B illustrates a schematic of a device including a capacitance network according to an embodiment.

FIG. 2B illustrates a schematic 200b of a device including a capacitance network 206 according to an embodiment. Field plates 204 include field plates 231-234 coupled with parasitic capacitances C30-C34. The capacitance network includes capacitors C35-C38 connected to the field plates 231-234, respectively. The values of capacitors C35-C38 may be selected so as to control (i.e., to select) the field plate potentials VFP1-VFP4; and by selecting the field plate potentials VFP1-VFP4, one may control an electric field along a drift region of transistor 202. The drift region of transistor 202 may be between the gate G and drain D; and there may be greater or fewer than four field plates 231-234. Accordingly, there may also be greater or fewer than four capacitors C35-C38.

Figure 2C:
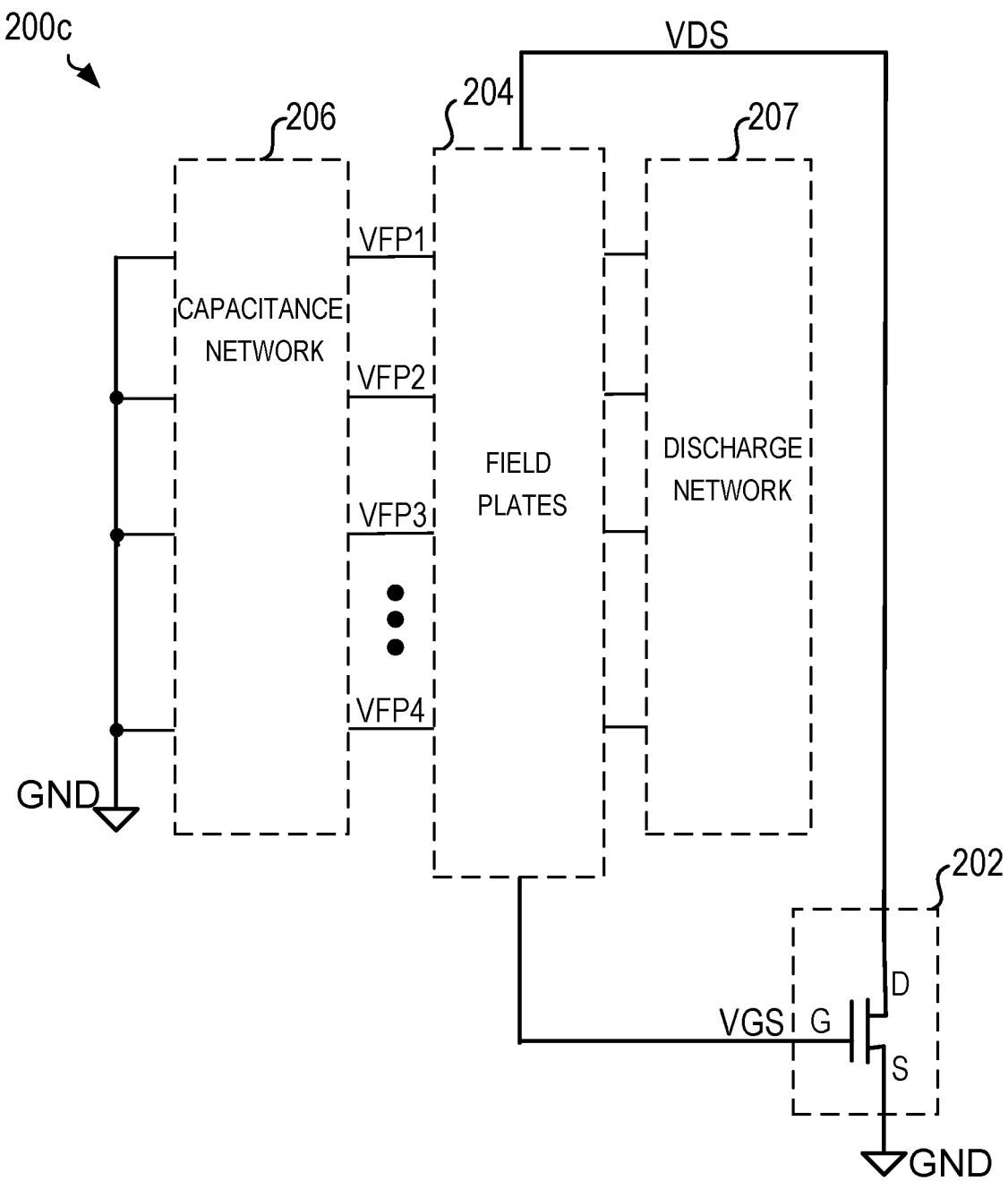
FIG. 2C illustrates a schematic of a device including a capacitance network according to an embodiment.

FIG. 2C illustrates a schematic 200c of a device including a capacitance network 206 according to an embodiment. Schematic 200c illustrates an embodiment including a discharge network 207. The discharge network 207 may also connect to field plates 204.

Figure 2D:
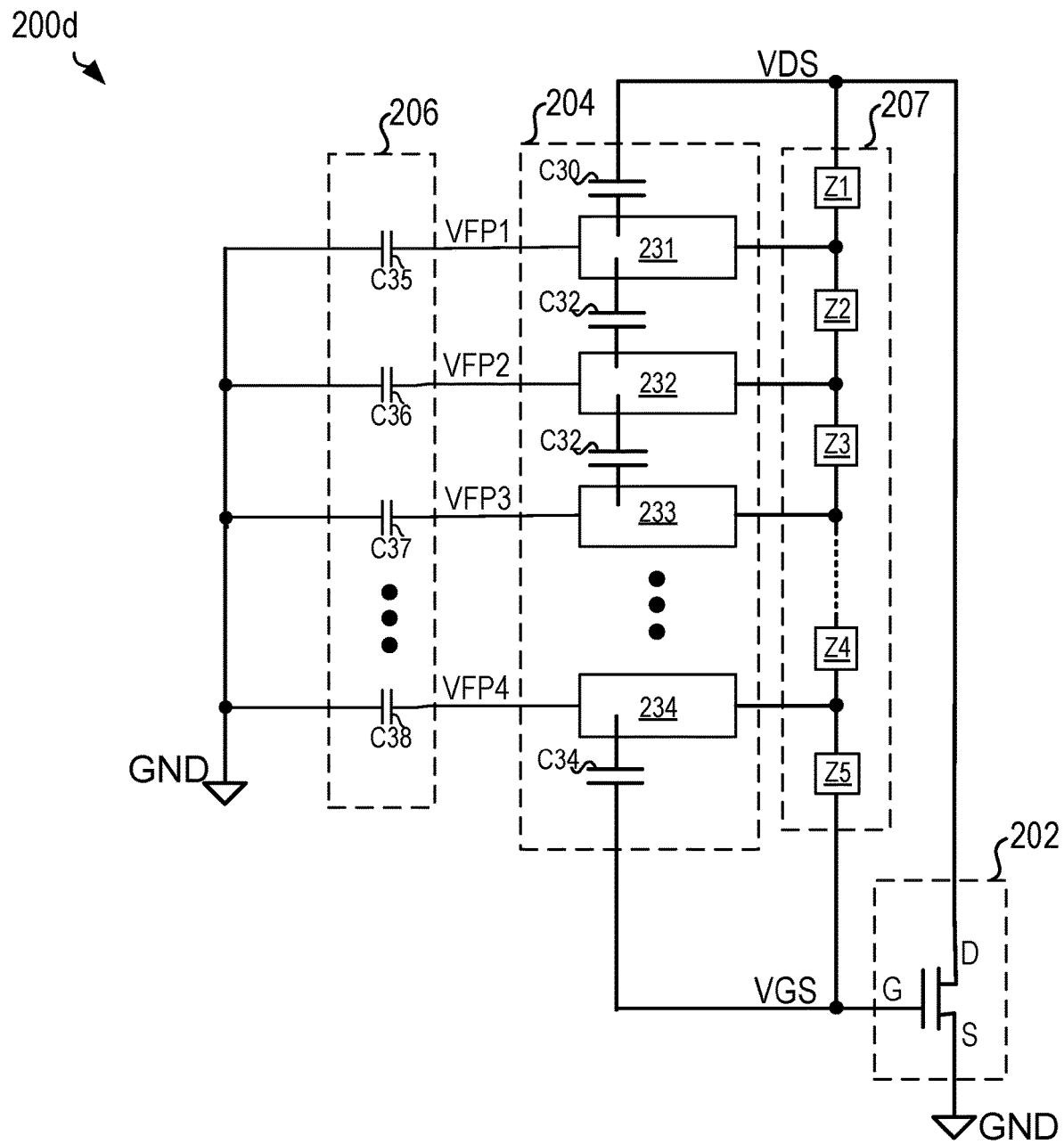
FIG. 2D illustrates a schematic of a device including a capacitance network according to an embodiment.

FIG. 2D illustrates a schematic of a device 200d including a capacitance network 206 according to an embodiment. As illustrated, the discharge network 207 may include impedances Z1-Z5 electrically coupled between the drain D and the gate G. The impedances are also electrically coupled to the field plates 231-234 so as to provide a discharge feature. In some embodiments the impedances Z1-Z5 may be implemented by active devices (e.g., field effect transistors). In other embodiments the impedances Z1-Z5 may be implemented by resistors and/or by passive components.

Figure 3A:
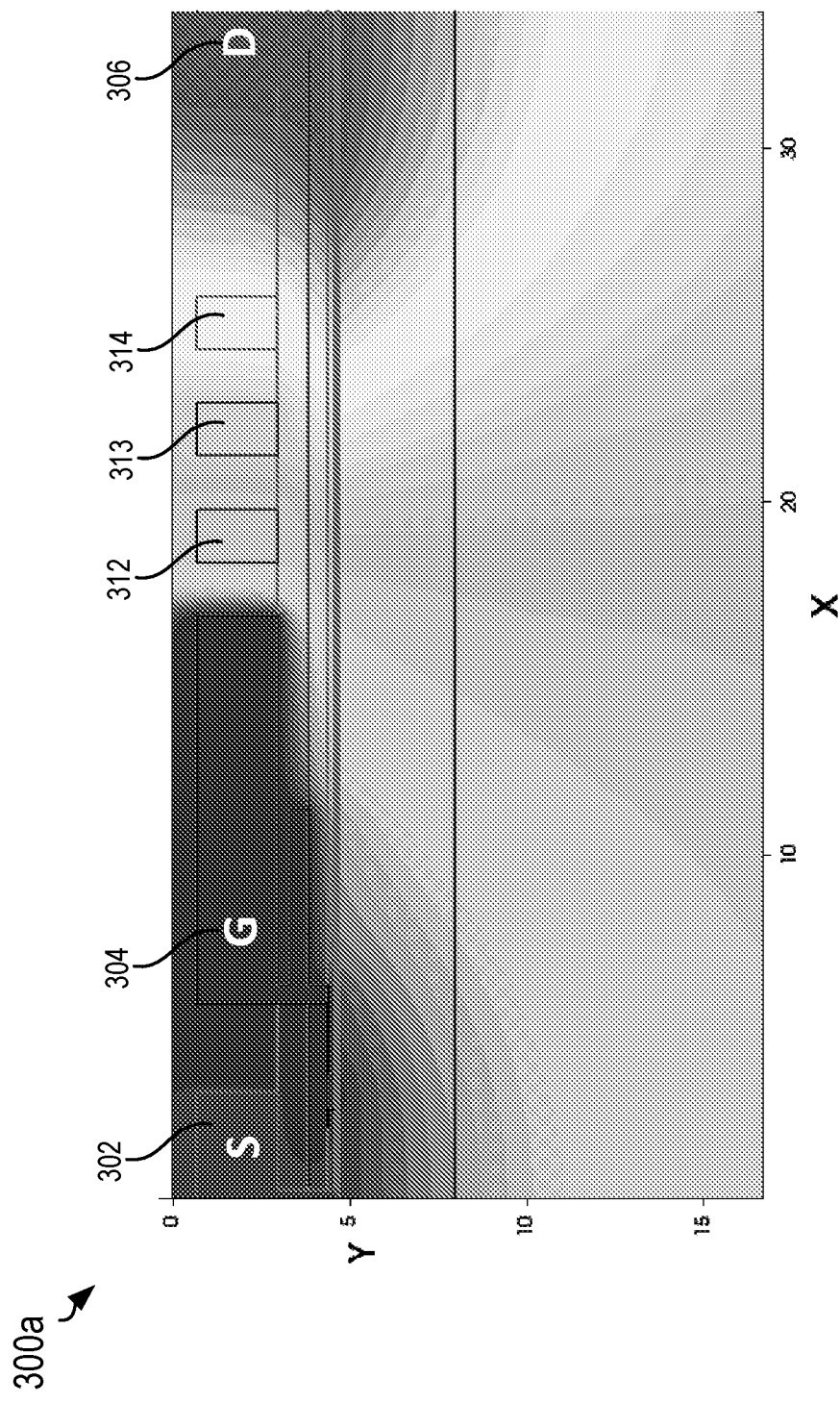
FIG. 3A illustrates a device cross section including potential contours according to an embodiment.

FIG. 3A illustrates a device cross section 300a including potential contours according to an embodiment. The device cross section 300a may be that of a HEMT device including a source (S) 302, a gate (G) 304, and a drain (D) 306. The device cross section 300a also shows field plates 312-314 located between the gate 304 and drain 306 along an "X" axis. The potential contours may be derived from a simulation of the device cross section 300a.

Figure 3B:
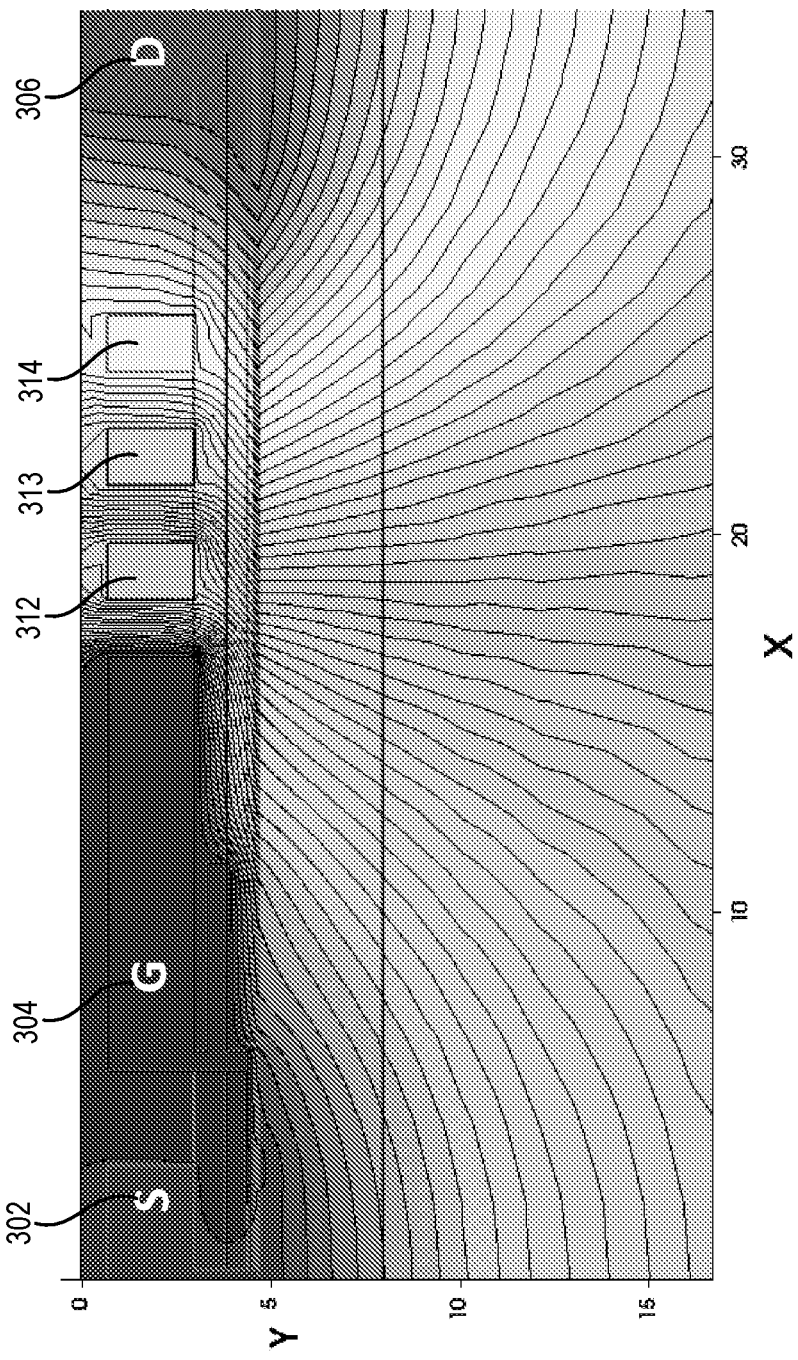
FIG. 3B illustrates a device cross section including potential contours according to an embodiment.

FIG. 3B illustrates a device cross section 300b including potential contours according to an embodiment. The potential contours are illustrated with lines and may also be derived using a device simulator.

Figure 3C:
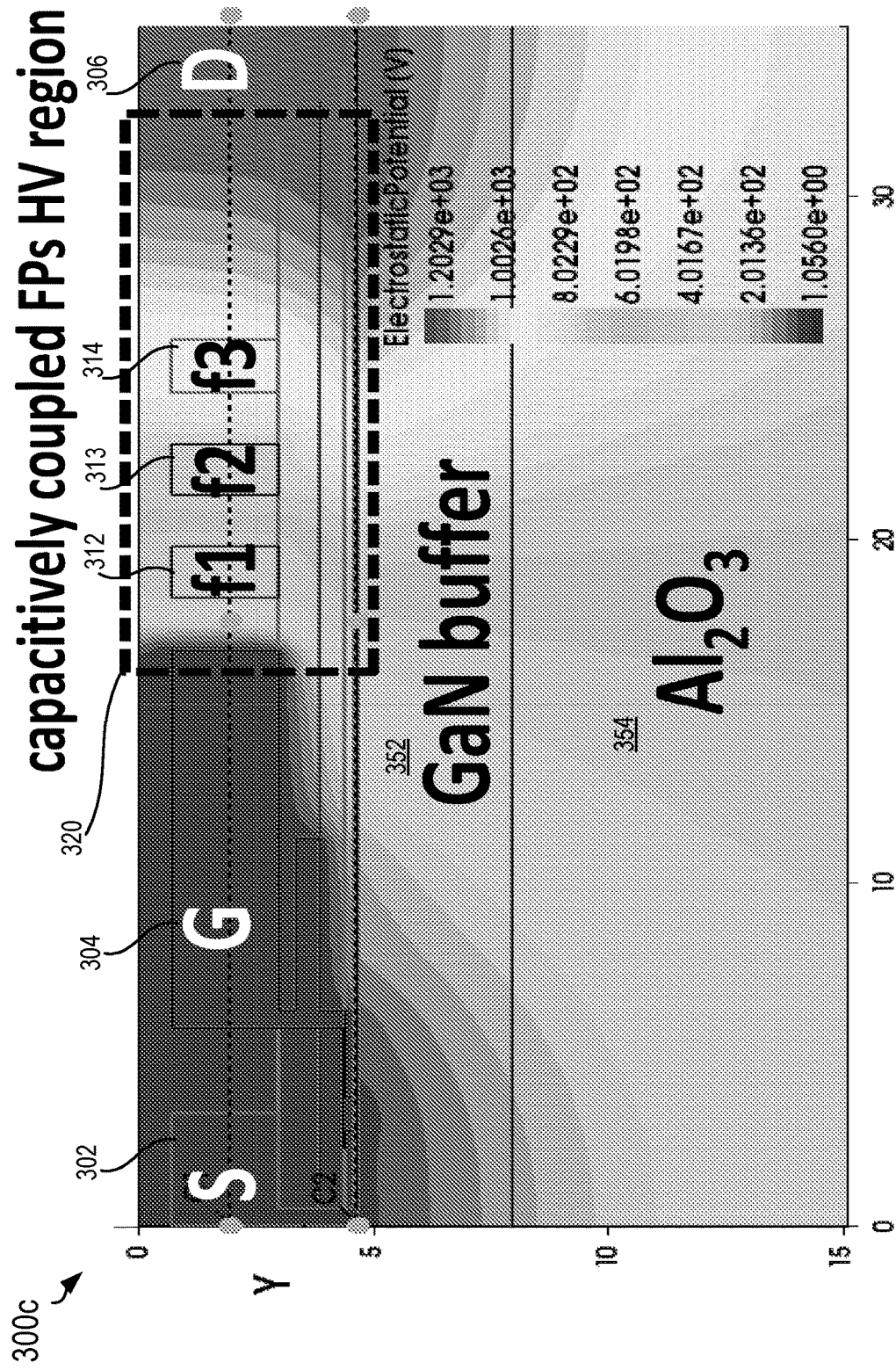
FIG. 3C illustrates a device cross section including potential contours according to an embodiment.

FIG. 3C illustrates a device cross section 300c including potential contours according to an embodiment. Device cross section 300c shows additional details relating to device materials and drift region. For instance, device cross section 300c shows a high voltage region 320 corresponding to where the field plates 312-314 are formed over a drift region (i.e., a high voltage region). The field plates 312-314 may also labelled as field plates f1-f3.

The device cross section 300c also delineates a GaN buffer layer 352 and an aluminum oxide ($Al_2O_3$) layer 354. In device cross section 300c, simulation values of electrostatic potential (V) may be illustrated according to a color coded key (e.g., with values ranging between 1.0560 and 1,202.9 volts).

FIG. 3C may correspond with a simulated potential contour for a 1200V device with three capacitively coupled field plates 312-314 (f1-f3). Assigning an adjusting external capacitance to each field plate, as means to emulate capacitance network, the device of FIG. 3C may be shown to support 1200V with a uniform 2DEG electric field in the extended HV region (see, e.g., FIG. 4C).

Figure 4A:
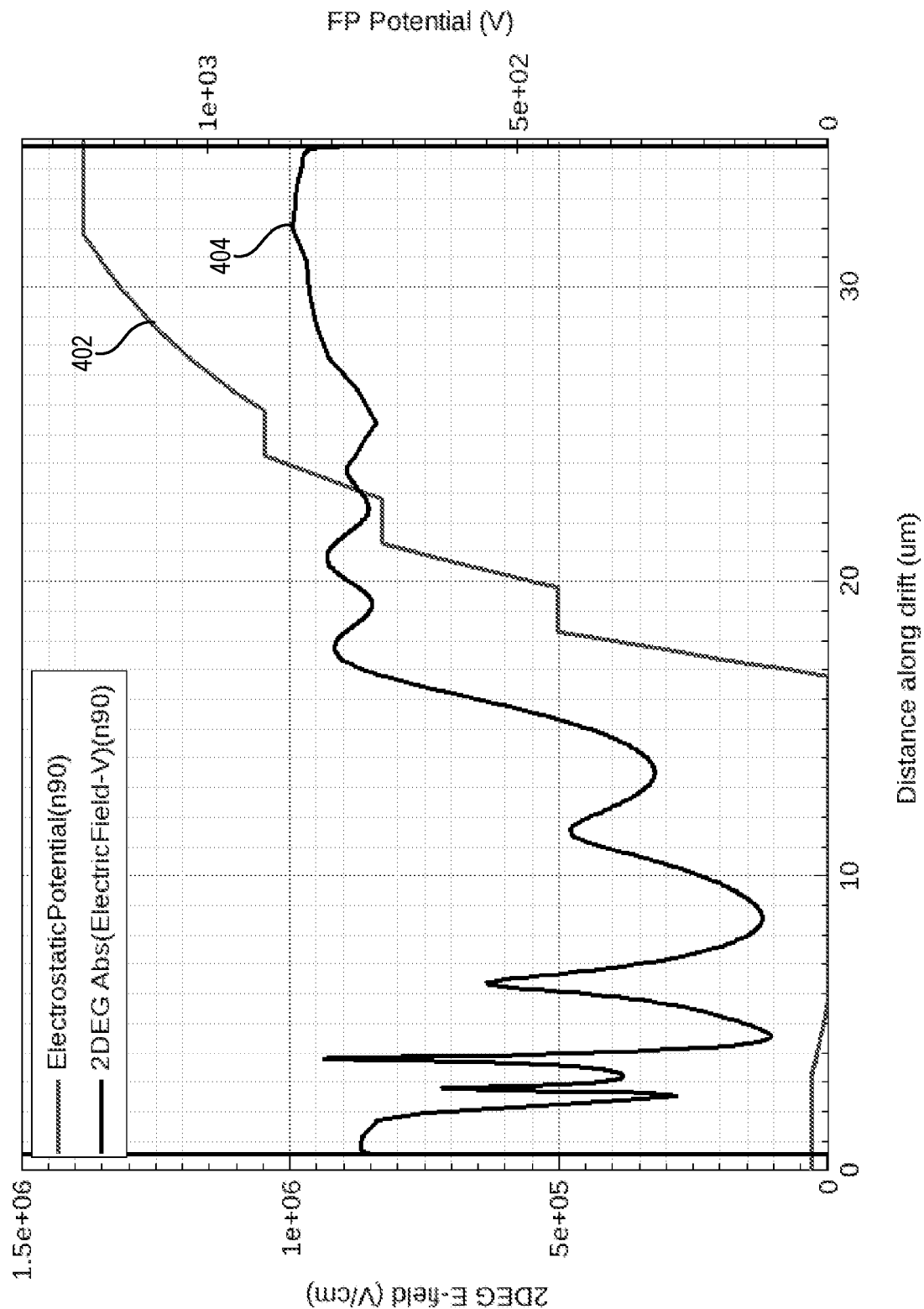
FIG. 4A illustrates plots of electric field and potential as a function of distance along a drift region according to an embodiment.

FIG. 4A illustrates plots 402, 404 of potential and electric field as a function of distance along a drift region according to an embodiment. The embodiment may correspond with the simulation results of device cross sections 300a-c. Additionally, plot 402 may correspond with potential and plot 404 may correspond with electric field. As illustrated, between about seventeen microns and thirty five microns, plot 404 is substantially uniform so as to improve plot 402 as a function of distance. In this way the maximum value of potential (i.e., plot 402) reaches approximately 1200 volts (V).

Figure 4B:
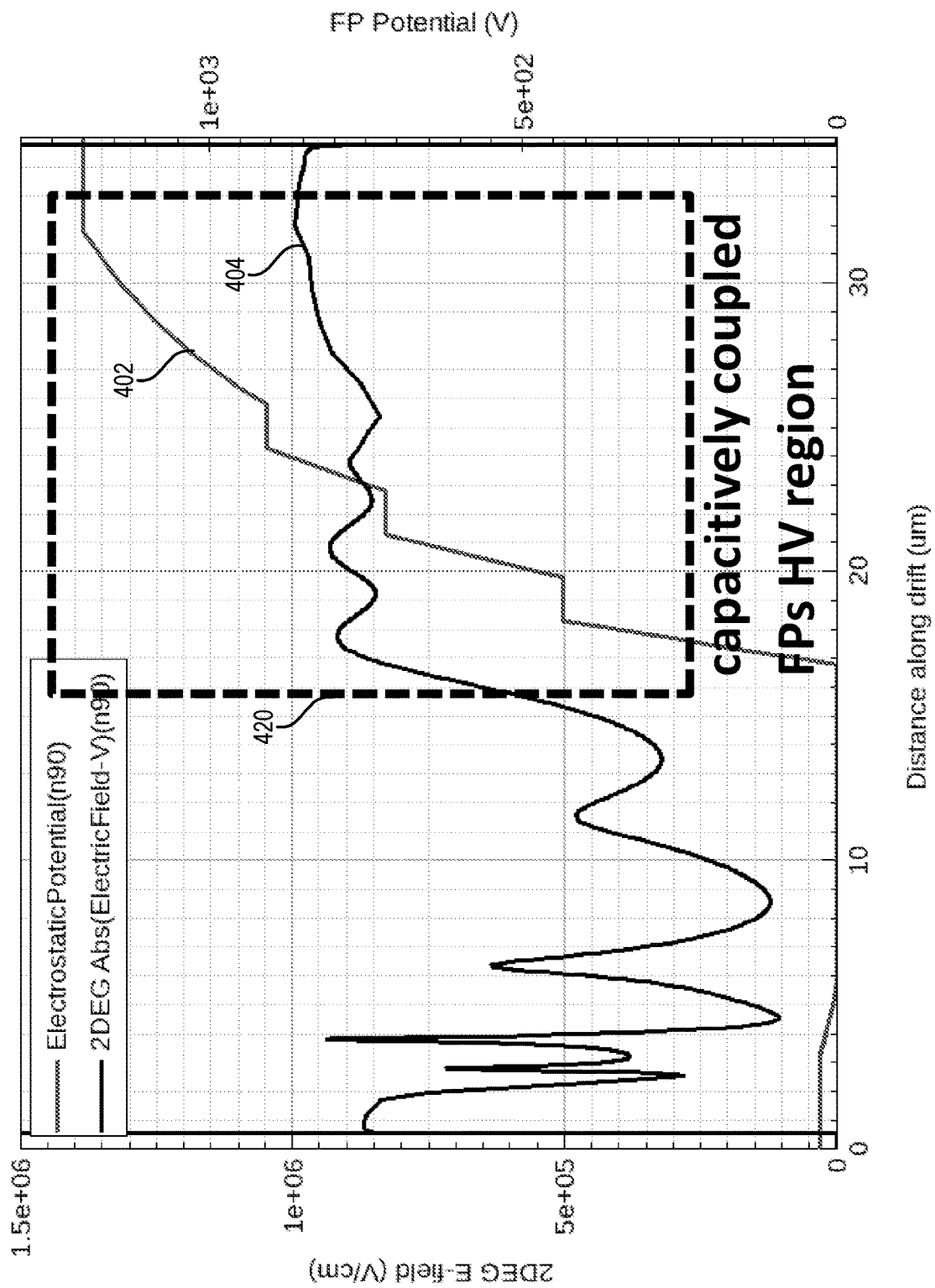
FIG. 4B illustrates plots of electric field and potential as a function of distance along a drift region according to an embodiment.

FIG. 4B illustrates plots 402, 404 of potential and electric field as a function of distance along a drift region according to an embodiment. FIG. 4B further delineates the location of the high voltage region 420 corresponding with the high voltage region 320. As illustrated by plot 404, electric field is substantially uniform within the high voltage region 420 (e.g., within the drift region).

Figure 4C:
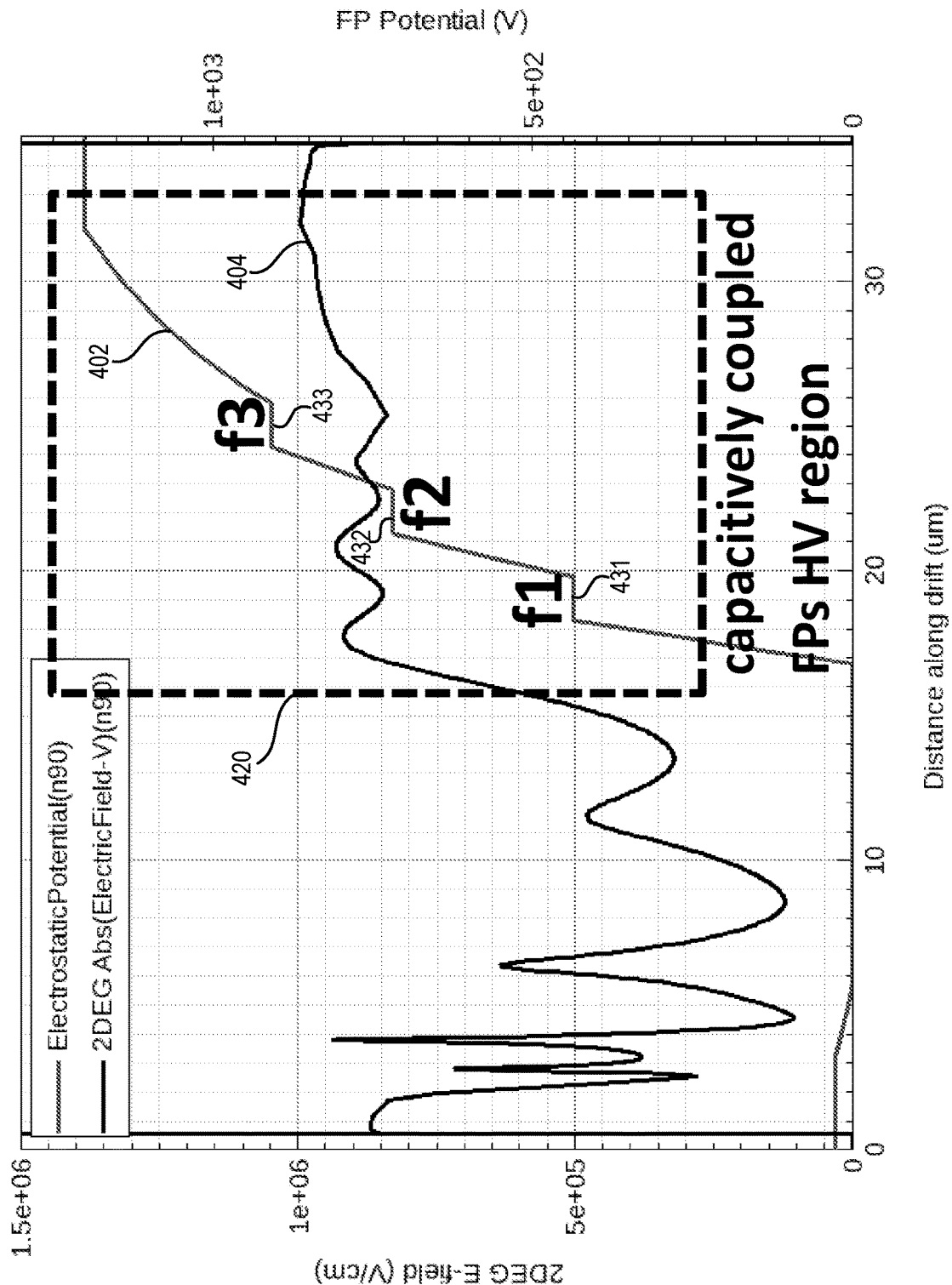
FIG. 4C illustrates plots of electric field and potential as a function of distance along a drift region according to an embodiment.

FIG. 4C illustrates plots 402, 404 of potential and electric field as a function of distance along a drift region according to an embodiment. FIG. 4C can be similar to FIG. 4B except it includes additional labels showing the locations of the field plates 312-314 (f1-f3). For instance, plot 404, corresponding to potential, shows plateaus 431-433 corresponding to the locations of field plates 312-314 (f1-f3).

As discussed above, the device may support 1200 volts with uniform 2DEG electric field in the extended high voltage (HV) region 420. A uniform electrical field in the two-dimensional electron gate (2DEG) region can advantageously provide a stable dynamic on-resistance (Rdson) in a GaN device.

Figure 5:
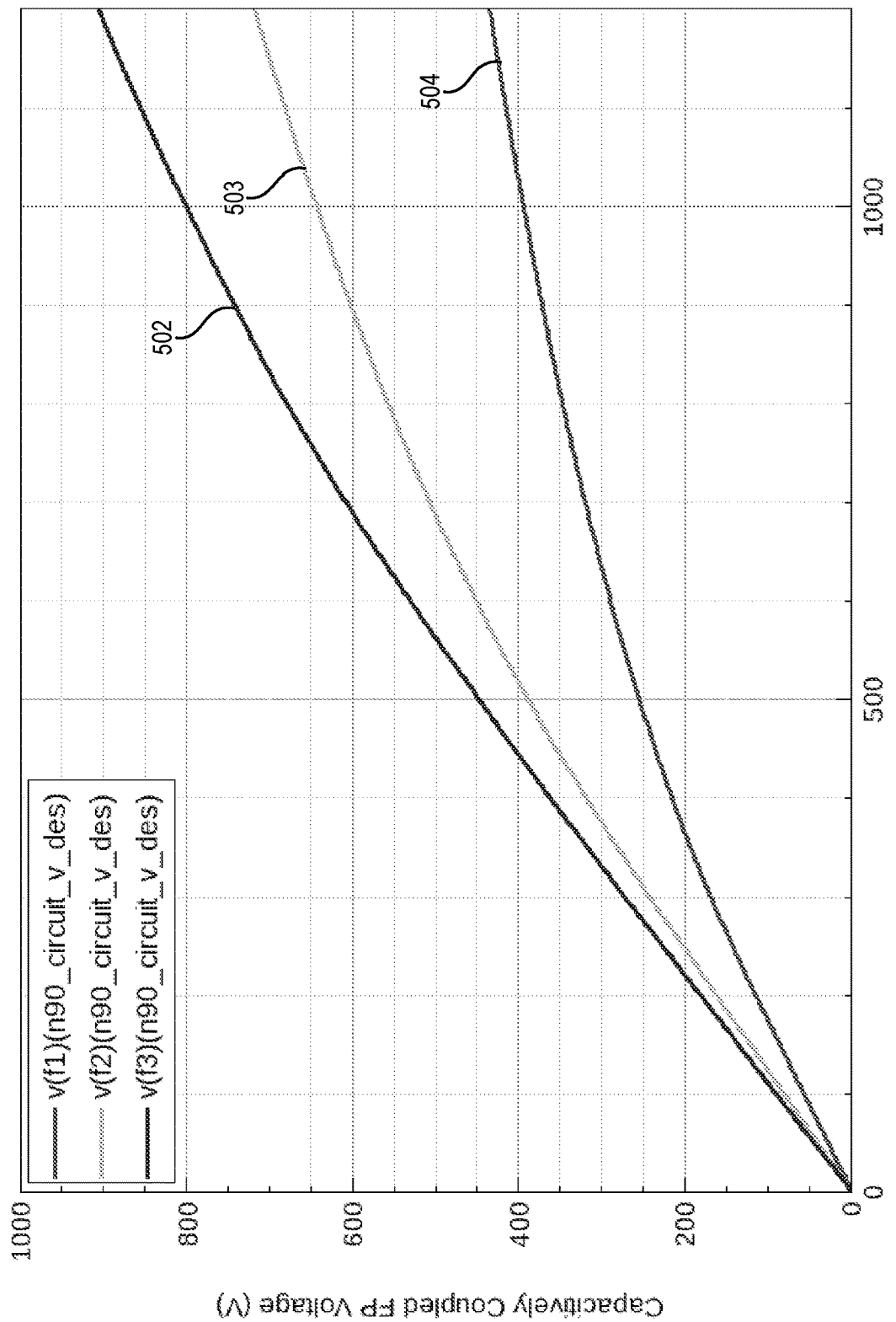
FIG. 5 illustrates plots corresponding to field plate potentials as a function of drain voltage according to an embodiment.

FIG. 5 illustrates plots corresponding to field plate potentials 502-504 as a function of drain voltage according to an embodiment. The embodiment may also correspond with the simulation results of device cross sections 300a-c. The field plate potentials 502-504 are provided as a function of drain voltage Vdrain and may show how a coupling ratio of each field plate 312-314 (e.g., field plates f1-f3) can be calculated by a ratio of a field plate potential to drain voltage.

Figure 6:
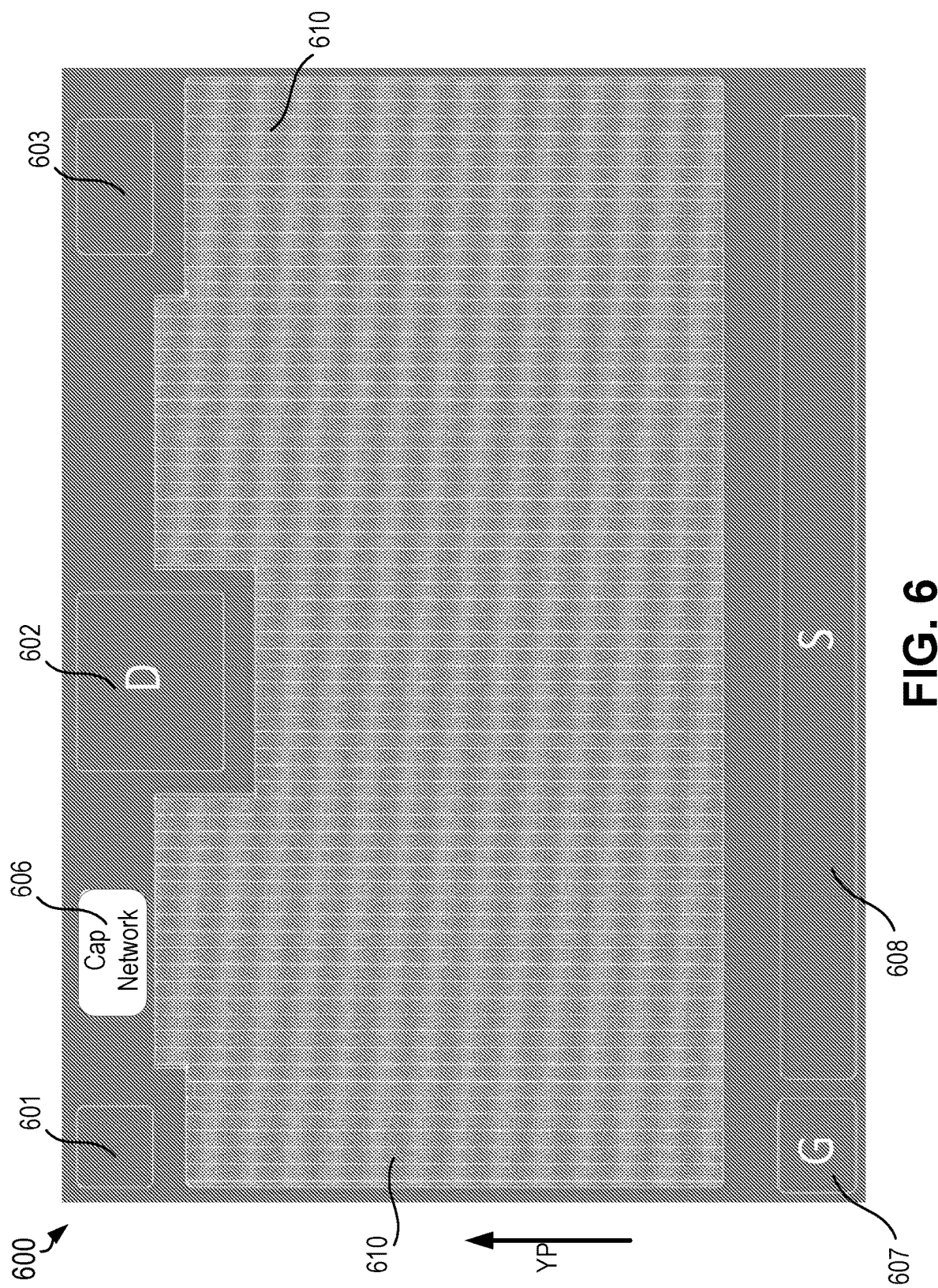
FIG. 6 illustrates a top layout view of a device according to an embodiment.

FIG. 6 illustrates a top layout view 600 of a device according to an embodiment. The top layout view 600 shows an active region 610 with stripes oriented parallel to a direction YP. As one of skill in the art may understand, transistors and/or semiconductor devices may be fabricated to have active regions wherein current, voltage, and/or power may be actively controlled; additionally there may be interconnect layers including pad layers adjacent to the active region(s). In this regard, the top layout view 600 also shows where interconnect (e.g., metallization and/or pad layers) may be located to connect to a drain D and a source S. For instance, pads 601-603 may be drain pads 601-603 allowing connection (i.e., electrical connection) to drain stripes and/or segments within the active region 610; and pad 608 may be a source pad 608 allowing connection (i.e., electrical connection) to source stripes and/or segments within the active region 610. Additionally, pad 607 may be a gate pad 607 allowing connection (i.e., electrical connection) to gate regions within the active region 610.

In one embodiment a capacitance network (e.g., capacitance network 140 and/or capacitance network 206) may be placed outside of the active region 610. For instance, as shown in FIG. 6, capacitance network 606 may be placed outside of the active region 610 near the drain pad 602. Additionally, field plates (e.g., field plates 131-134, field plates 204, and/or field plates 312-314) may be placed inside the active region 610. For instance, field plates, such as field plates 312-314, may be positioned parallel to the direction YP and within (i.e., inside) the active region 610. Although FIG. 6 shows capacitance network 606 as being placed near the drain pad 602, other placements are possible. For instance, the capacitance network 606 may be placed near or within the source pad 608. Alternatively, a device may use a layout with multiple capacitance networks and/or integrated capacitance networks as described below with regards to FIG. 10A and FIG. 11A.

Figure 7:
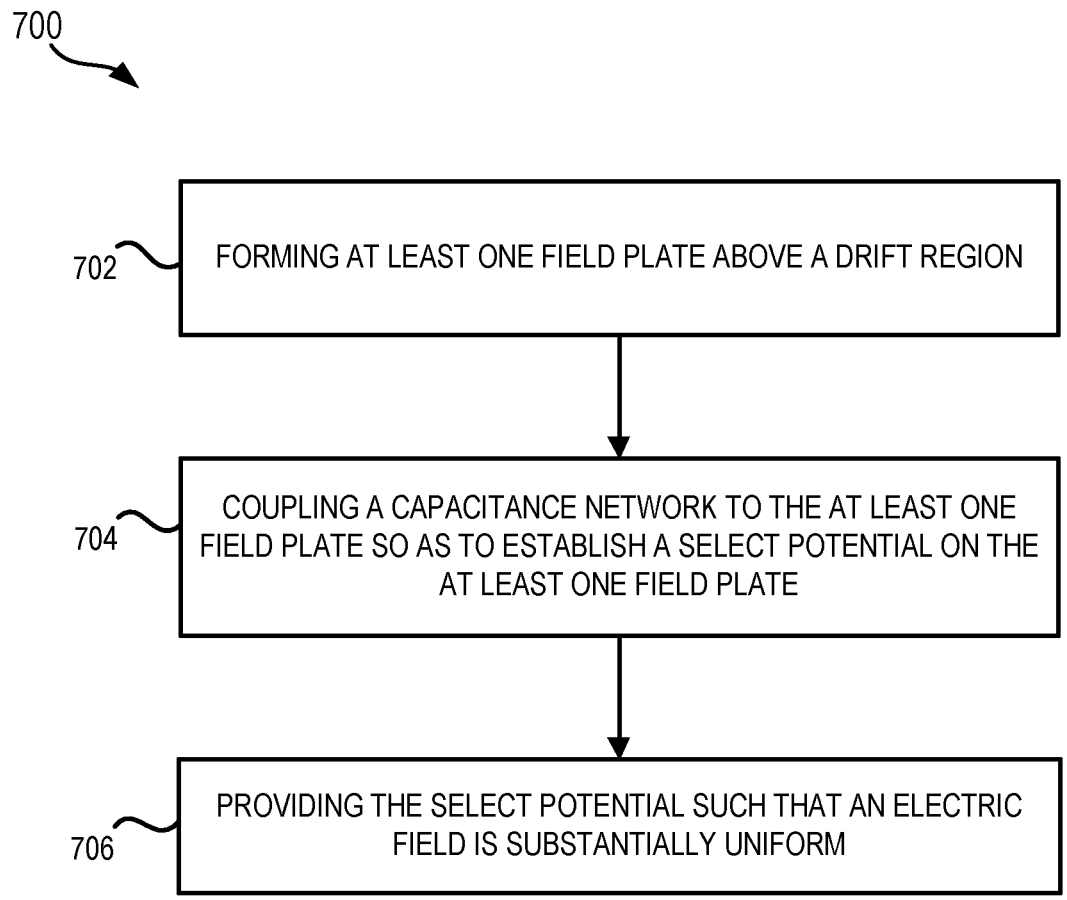
FIG. 7 illustrates a conceptual flow diagram for distributing an electric field in a drift region according to an embodiment.

FIG. 7 illustrates a conceptual flow diagram 700 for distributing an electric field in a drift region (e.g., a high voltage region 320 and/or 420) according to an embodiment. Step 702 may correspond with forming at least one field plate (e.g., any one of field plates 131-134, 231-234, 312-314, and/or f1-f3) above the drift region. Step 704 may correspond with coupling a capacitance network (e.g., capacitance network 140, 206) to the at least one field plate so as to establish a select potential (e.g., any one of field plate potentials VFP1-VFP4) on the at least one field plate. Step 706 may correspond with providing the select potential such that an electric field (see, e.g., plot 404 of electric field) is substantially uniform (see, e.g., plot 404 within high voltage region 420).

Figure 8:
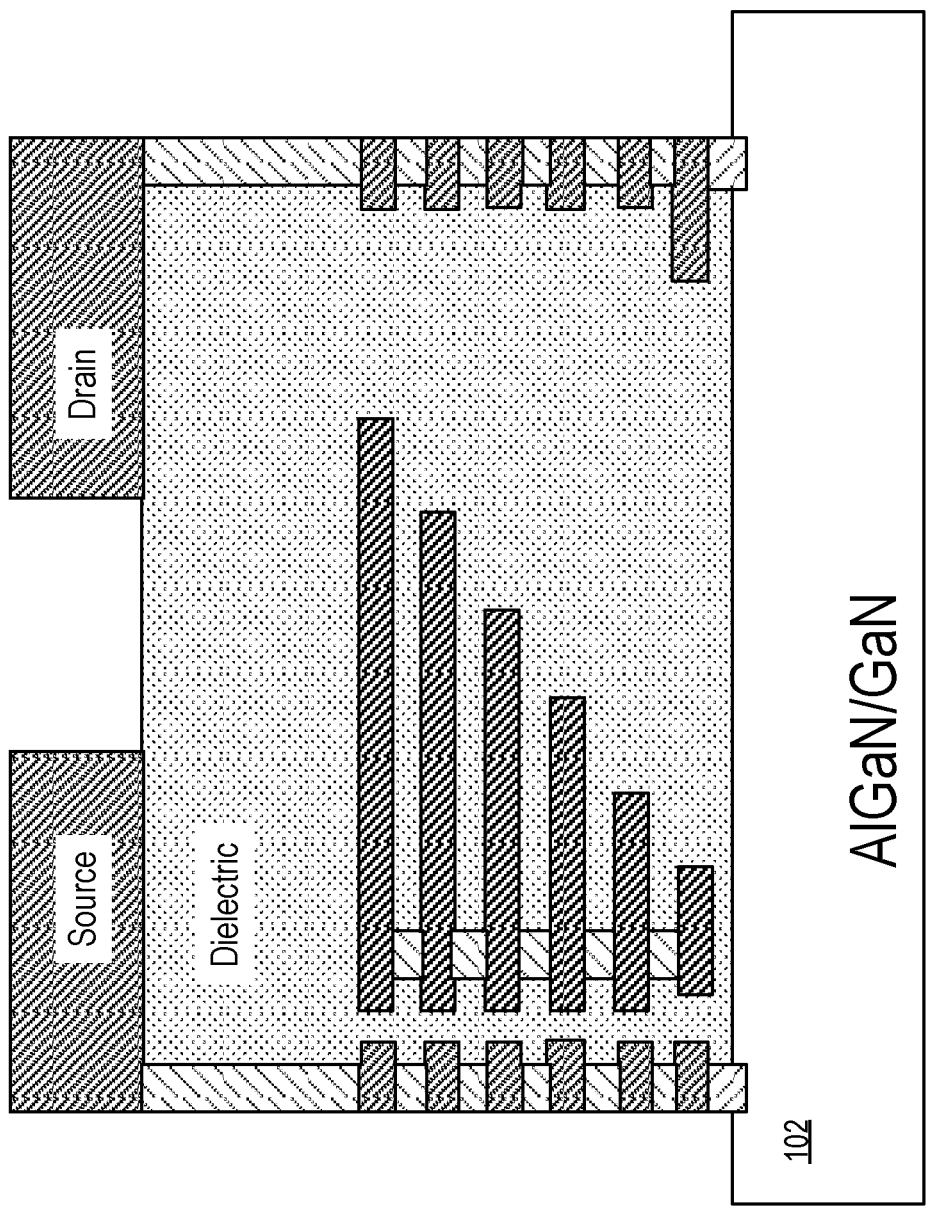
FIG. 8 illustrates a traditional field plate design for a high voltage lateral gallium nitride device.
Figure 9:
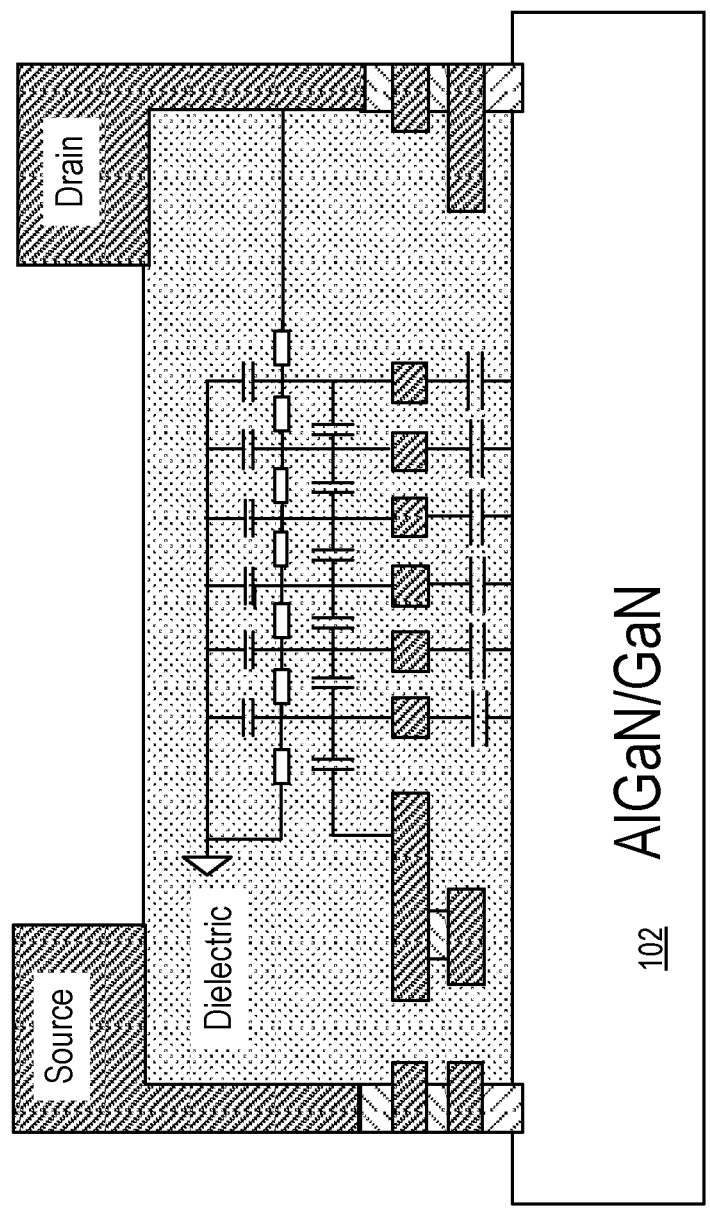
FIG. 9 illustrates a lateral gallium nitride device cross-section and electrical schematic according to the teachings herein.

FIG. 8 illustrates a traditional field plate design for a high voltage lateral gallium nitride device; and FIG. 9 illustrates a lateral gallium nitride device cross-section and electrical schematic according to the teachings herein. FIG. 9 may further illustrate parasitic capacitance, resistor static discharge network elements, and a capacitance network for coupling ratio establishment. A capacitance network can be realized by a metal-insulator-metal (MIM) structure; a MIM structure can be inherent to a GaN process. The MIM structure can be realized through vertical metal plates and/or adjacent metal comb plates.

Figure 10A:
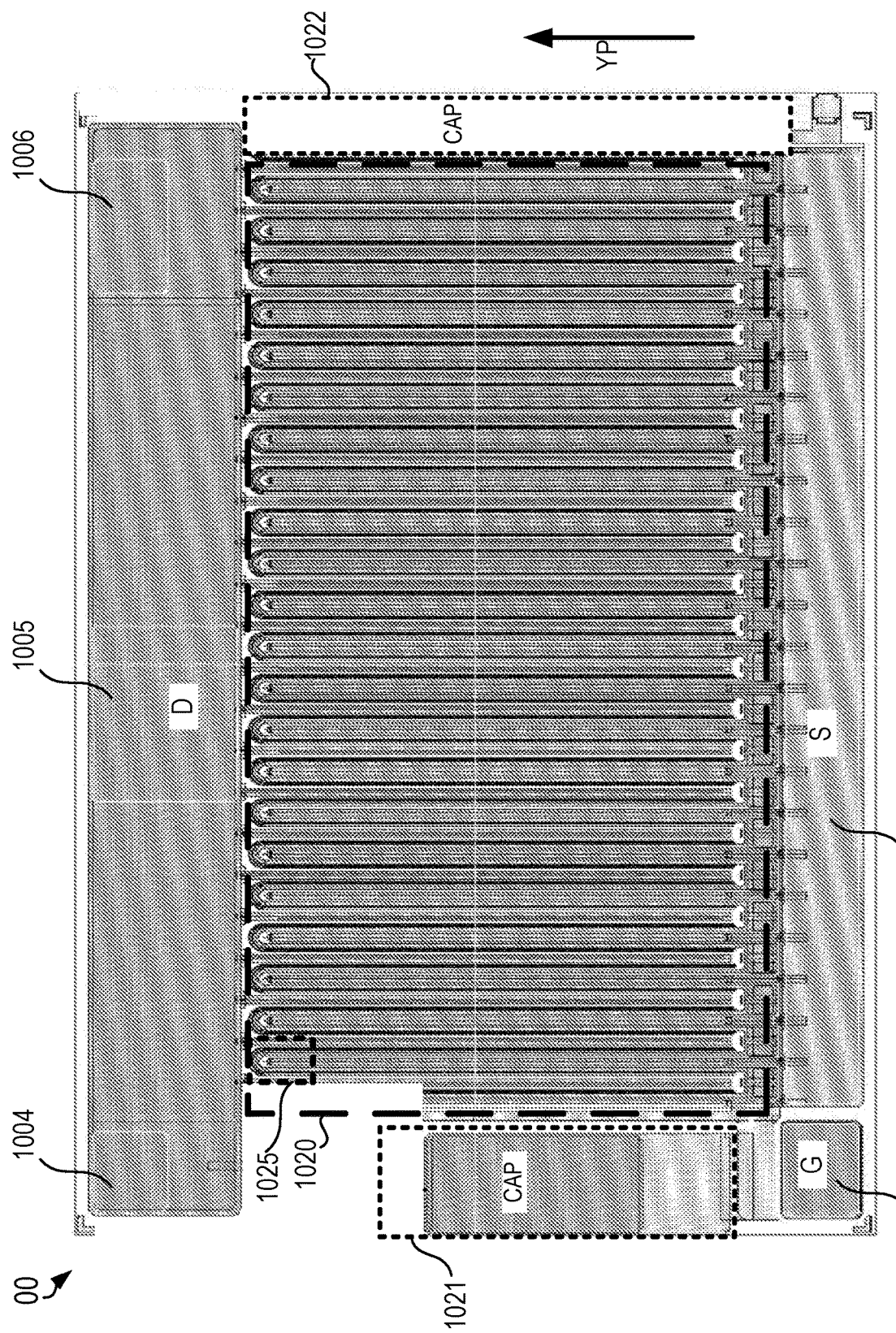
FIG. 10A illustrates a top layout view of a device according to an embodiment.

FIG. 10A illustrates a top layout view 1000 of a device according to an embodiment. Similar to top layout view 600, the top layout view 1000 shows an active region 1020 with stripes oriented parallel to the direction YP. Additionally, the top layout view 1000 also shows where interconnect (e.g., metallization and/or pad layers) may be located to connect to the drain D and the source S. For instance, pads 1004-1006 may be drain pads 1004-1006 allowing connection (i.e., electrical connection) to drain stripes and/or segments within the active region 1020; and pad 1024 may be a source pad 1024 allowing connection (i.e., electrical connection) to source stripes and/or segments within the active region 1020. Additionally, pad 1023 may be a gate pad 1023 allowing connection (i.e., electrical connection) to gate regions within the active region 1020.

In the embodiment of top layout view 1000 a capacitance network (e.g., capacitance network 140 and/or capacitance network 206) may include a capacitor 1021 and a capacitor 1022 placed outside of the active region 1020. Field plates, such as field plates 312-314, may be positioned parallel to the direction YP and within (i.e., inside) the active region 1020.

Figure 10B:
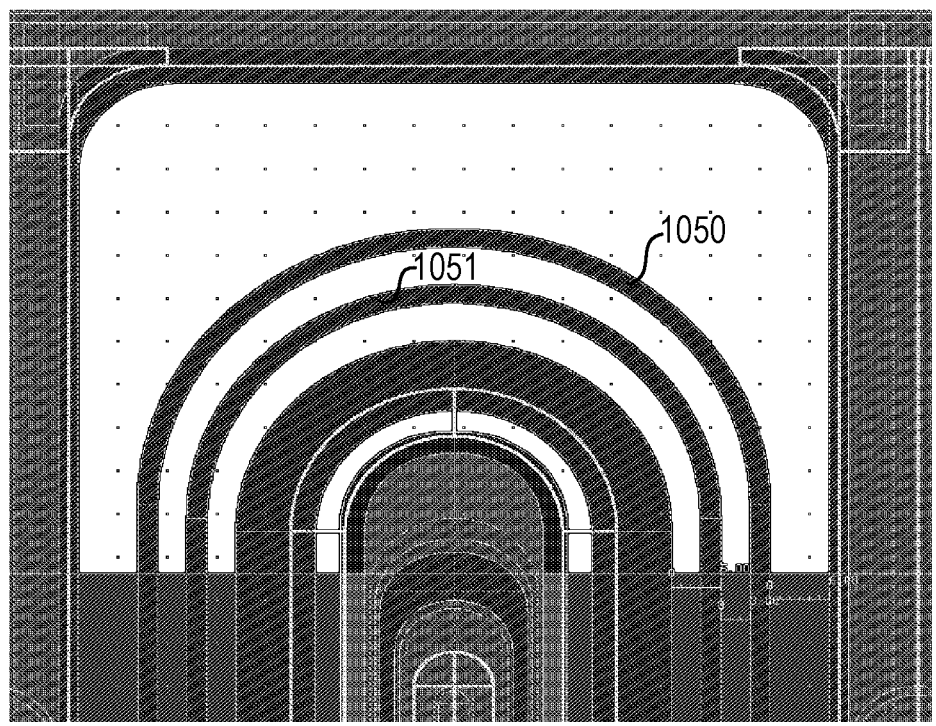
FIG. 10B illustrates a top layout view of a stripe region according to the embodiment of FIG. 10A.

For instance, FIG. 10B illustrates a top layout view of the stripe region 1025 according to the embodiment of FIG. 10A and shows a field plate pattern 1050 and field plate pattern 1051. Field plate pattern 1050 may electrically couple to capacitor 1021 (or capacitor 1022); and field plate pattern 1051 may electrically couple to capacitor 1022 (or capacitor 1021). In one embodiment, capacitors 1021 and 1022 may have capacitance values in the range of one to ten picoFarads (pF); for instance, capacitor 1021 may have a value of 5.4 pF and capacitor 1022 may have a value of 7.6 pF.

Figure 11A:
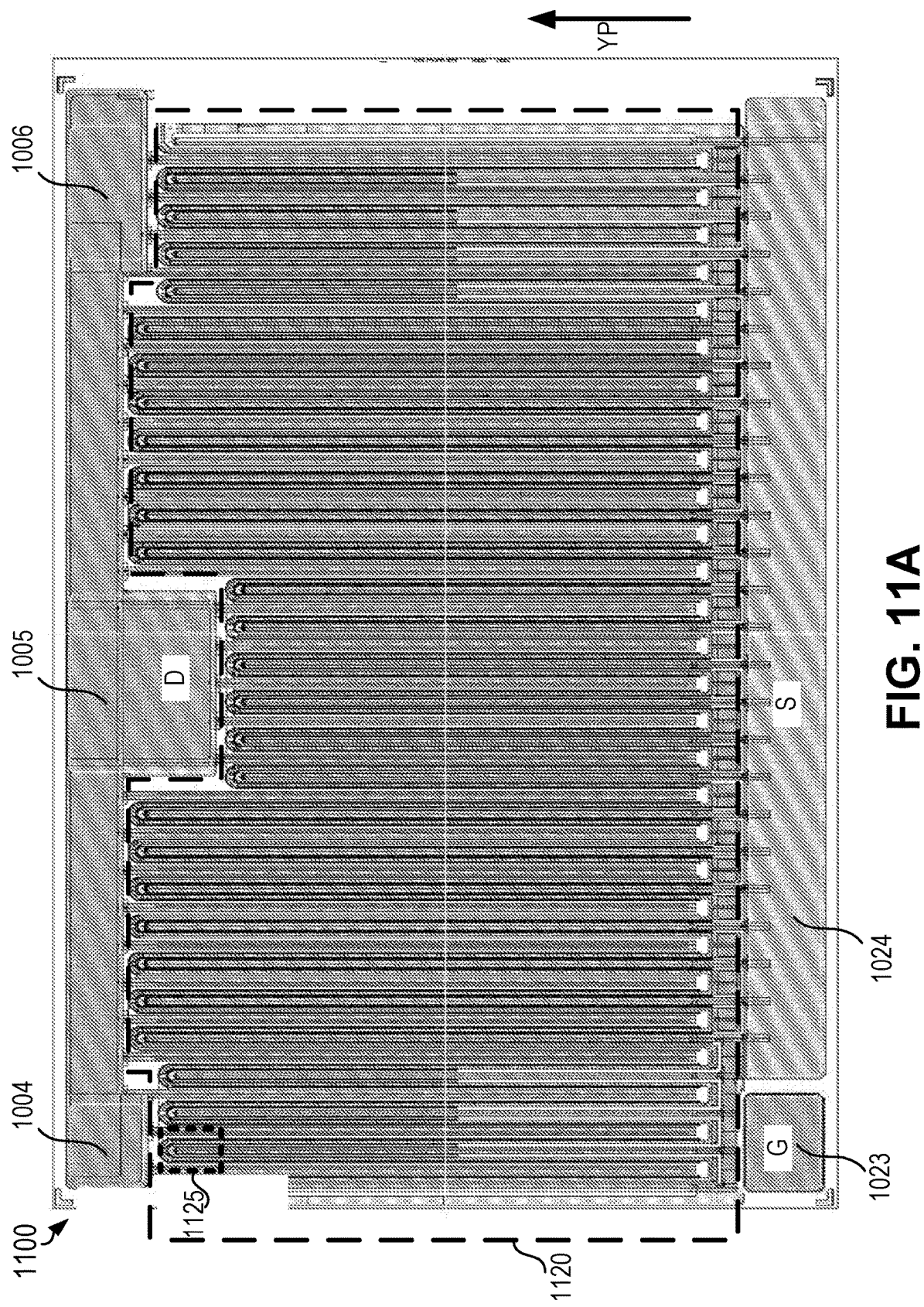
FIG. 11A illustrates a top layout view of a device according to an embodiment.

FIG. 11A illustrates a top layout view 1100 of a device according to an embodiment. Similar to top layout view 600 and top layout view 1000, the top layout view 1100 shows an active region 1120 with stripes oriented parallel to the direction YP. However, unlike the embodiments shown in top layout views 600 and 1000, the device of top layout view 1100 realizes a capacitor network (e.g., capacitance network 140 and/or capacitance network 206) using an embedded capacitor distributed within the active region 1120.

Figure 11B:
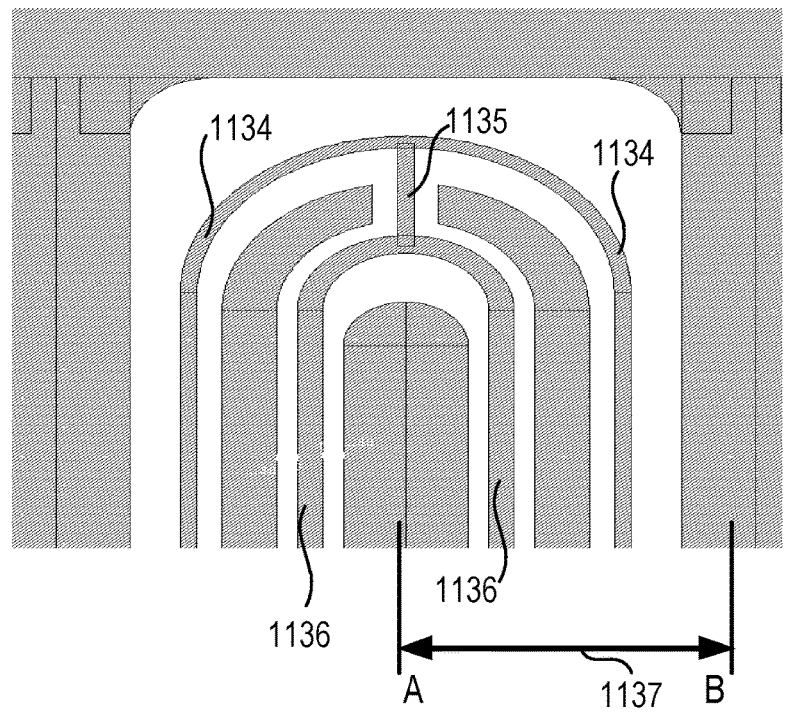
FIG. 11B illustrates a top layout view of a stripe region according to the embodiment of FIG. 11A.
Figure 11C:
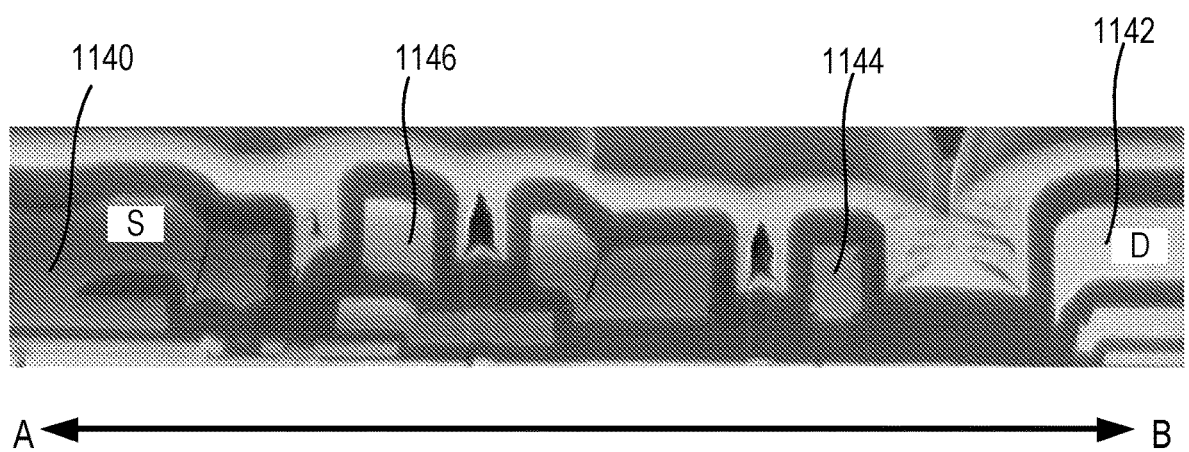
FIG. 11C illustrates a cross sectional view of the stripe region according to the embodiment of FIG. 11A.

For instance, FIG. 11B illustrates a top layout view and FIG. 11C illustrates a cross sectional view of the stripe region 1125 according to the embodiment of FIG. 11A. FIG. 11B illustrates a field plate pattern 1134 is electrically coupled with an embedded capacitor pattern 1136 by an interconnect link 1135.

A cross section line 1137 delineated between points A (source S) and B (drain D) of top layout view may correspond with the cross sectional view of FIG. 11C. Point A may align (and be electrically coupled) with source interconnect 1140; and point B may align (and be electrically coupled) with drain interconnect 1142. The embedded capacitor pattern 1136 may be electrically coupled with embedded capacitor 1146; and the field plate pattern 1134 may be electrically coupled with field plate 1144.

A problem solved by capacitance networks for enhancing high voltage operation of high electron mobility transistors (HEMTs) may include enabling high voltage operation of a lateral gallium nitride (GaN) device without adding process complexity and cost.

Ideal (i.e., traditional) field plate design for a lateral HV device may have a nearly square e-field distribution along drift region. This may be achieved by increasing level of field plates with increasing dielectric thickness as breakdown voltage increases (see, e.g., FIG. 8); but this adds process cost and complexity. The teachings herein may be applicable to a lateral GaN device with a number of capacitively coupled field plates; and the field plates may preferably built on the same metal layer for lower cost, whereby the potential on each field plate may be pre-determined through a capacitance network, resulting in a uniform e-field distribution along drift region at maximum operating voltage.

Additionally, a function of capacitance networks may be to establish a desired potential on each capacitively coupled field plate, by means of pre-determined capacitance in combination with parasitic capacitance to result in the right (e.g., the ideal or substantially ideal) coupling ratio.

The above description of illustrated examples of the present disclosure, including what is described in the Abstract, are not intended to be exhaustive or to be limitation to the precise forms disclosed. While specific embodiments of capacitance networks for enhancing high voltage operation of high electron mobility transistors are described herein for illustrative purposes, various equivalent modifications are possible without departing from the broader spirit and scope of the present disclosure. Indeed, it is appreciated that the specific example device cross sections are provided for explanation purposes and that other embodiments may also be employed in accordance with the teachings herein.

Although the present invention is defined in the claims, it should be understood that the present invention can alternatively be defined in accordance with the following examples:

Example 1. A high electron mobility transistor (HEMT) comprising: a drift region; at least one field plate disposed above the drift region, wherein the drift region is configured to support an electric field; and a capacitance network electrically coupled to the at least one field plate, wherein the capacitance network is configured to distribute the electric field.

Example 2. The HEMT of example 1, wherein the HEMT is a lateral gallium nitride (GaN) semiconductor device.

Example 3. The HEMT of any of the preceding examples, wherein the capacitance network is configured to uniformly distribute the electric field.

Example 4. The HEMT of any of the preceding examples, wherein the capacitance network is configured to establish a select potential on the at least one field plate.

Example 5. The HEMT of any of the preceding examples, wherein the select potential is selected to uniformly distribute the electric field.

Example 6. The HEMT of any of the preceding examples, wherein the capacitance network comprises at least one impedance configured to discharge the at least one field plate.

Example 7. A semiconductor device comprising: a drift region formed laterally between a gate and a drain, wherein the drift region is configured to support an electric field; a plurality of field plates disposed above the drift region, the plurality of field plates comprising: a first field plate configured to support a first potential; and a second field plate configured to support a second potential; and a capacitance network electrically coupled to the plurality of field plates, wherein the capacitance network is configured to establish the first potential and the second potential so as to distribute the electric field.

Example 8. The semiconductor device of example 7, wherein the capacitance network is configured to establish the first potential and the second potential.

Example 9. The semiconductor device of any one of examples 7-8, wherein the capacitance network comprises: a first capacitor electrically coupled to the first field plate; and a second capacitor electrically coupled to the second field plate.

Example 10. The semiconductor device of any one of examples 7-9, wherein the capacitance network is an external capacitance network.

Example 11. The semiconductor device of any one of examples 7-10, wherein the capacitance network comprises an embedded capacitor.

Example 12. The semiconductor device of any one of examples 7-11, wherein the first capacitor is configured to establish the first potential and the second capacitor is configured to established the second potential.

Example 13. The semiconductor device of any one of examples 7-12, wherein the first capacitor is electrically coupled between a direct current (DC) potential and the first field plate, and the second capacitor is electrically coupled between the DC potential and the second field plate.

Example 14. The semiconductor device of any one of examples 7-13, wherein the capacitance network further comprises: a first impedance electrically coupled between the DC potential and the first field plate; and a second impedance electrically coupled between the drain and the second field plate.

Example 15. The semiconductor device of any one examples 7-14, wherein the DC potential is ground.

Example 16. The semiconductor device of any one of examples 7-15, wherein the plurality of field plates comprises a third field plate configured to support a third potential; wherein the capacitance network comprises: a third capacitor electrically coupled between the DC potential and the third field plate; a third impedance electrically coupled between the first field plate and the third field plate; and a fourth impedance electrically coupled between the third field plate and the second field plate.

Example 17. The semiconductor device of any one of examples 7-16, wherein the capacitance network is configured to establish the first potential, the second potential, and the third potential so as to distribute the electric field.

Example 18. The semiconductor device of any one of examples 7-17, wherein the electric field is substantially uniform.

Example 19. The semiconductor device of any one of examples 7-18, wherein the electric field sustains a voltage of at least one-thousand two-hundred volts.

Example 20. A method of distributing an electric field in a drift region of a high voltage semiconductor device comprising: forming at least one field plate above a drift region; coupling a capacitance network to the at least one field plate so as to establish a select potential on the at least one field plate; and providing the select potential such that the electric field is substantially uniform.

Example 21. The method of example 20, wherein coupling the capacitance network to the at least one field plate comprises coupling a first capacitor to the at least one field plate.

Example 22. The method of any one of examples 20-21, wherein coupling the capacitance network to the at least one field plate comprises coupling a static discharge impedance to the at least one field plate.

Example 23. The method of any one of examples 20-22, wherein forming the at least one field plate above the drift region comprises forming the at least one field plate inside an active region.

Example 24. The method of any one of examples 20-23, wherein coupling the capacitance network to the at least one field plate comprises forming the capacitance network outside the active region.

What is claimed is:

1. A semiconductor device comprising:
    a drift region formed laterally between a gate and a drain, wherein the drift region is configured to support an electric field;
    a plurality of field plates disposed above the drift region, the plurality of field plates comprising:
        a first field plate configured to support a first potential;
        a second field plate configured to support a second potential; and
        a third field plate configured to support a third potential;
    a capacitance network electrically coupled to the plurality of field plates, wherein the capacitance network is configured to establish the first potential and the second potential so as to distribute the electric field, the capacitance network comprising:
        a first capacitor electrically coupled to the first field plate;
        a second capacitor electrically coupled to the second field plate; and
        a third capacitor electrically coupled between a direct current (DC) potential and the third field plate; and
    a discharge network comprising a plurality of field effect transistors electrically coupled to the plurality of field plates, the plurality of field effect transistors comprising:
        a first field effect transistor electrically coupled between the DC potential and the first field plate;
        a second field effect transistor electrically coupled between the drain and the second field plate;
        a third field effect transistor electrically coupled between the first field plate and the third field plate, and a fourth field effect transistor electrically coupled between the third field plate and the second field plate.

2. The semiconductor device of claim 1, wherein the capacitance network is configured to establish the first potential and the second potential.

3. The semiconductor device of claim 1, wherein the capacitance network is an external capacitance network.

4. The semiconductor device of claim 1, wherein the capacitance network comprises an embedded capacitor.

5. The semiconductor device of claim 1, wherein the first capacitor is configured to establish the first potential and the second capacitor is configured to establish the second potential.

6. The semiconductor device of claim 1, wherein the first capacitor is electrically coupled between a direct current (DC) potential and the first field plate, and the second capacitor is electrically coupled between the DC potential and the second field plate.

7. The semiconductor device of claim 1, wherein the DC potential is ground.

8. The semiconductor device of claim 1, wherein the capacitance network is configured to establish the first potential, the second potential, and the third potential so as to distribute the electric field.

9. The semiconductor device of claim 8, wherein the electric field is uniform.

10. The semiconductor device of claim 9, wherein the electric field sustains a voltage of at least one-thousand two-hundred volts.

* * * * *